(12) United States Patent
Ndoye et al.

(10) Patent No.: US 9,116,432 B2
(45) Date of Patent: Aug. 25, 2015

(54) MULTIPLE EXPOSURE WITH IMAGE REVERSAL IN A SINGLE PHOTORESIST LAYER

(75) Inventors: Coumba Ndoye, Rensselaer, NY (US); Marius Orlowski, Pembroke, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 13/814,356

(22) PCT Filed: Aug. 9, 2011

(86) PCT No.: PCT/US2011/047054
§ 371 (c)(1),
(2), (4) Date: Feb. 5, 2013

(87) PCT Pub. No.: WO2012/021498
PCT Pub. Date: Feb. 16, 2012

(65) Prior Publication Data
US 2013/0129991 A1    May 23, 2013

Related U.S. Application Data

(60) Provisional application No. 61/371,890, filed on Aug. 9, 2010, provisional application No. 61/383,580, filed on Sep. 16, 2010, provisional application No. 61/446,707, filed on Feb. 25, 2011.

(51) Int. Cl.
*G03F 7/20* (2006.01)
*H01L 21/027* (2006.01)
*G03F 7/095* (2006.01)
*G03F 7/26* (2006.01)

(52) U.S. Cl.
CPC .............. *G03F 7/2022* (2013.01); *G03F 7/203* (2013.01); *G03F 7/2024* (2013.01); *H01L 21/0272* (2013.01); *H01L 21/0274* (2013.01); *G03F 7/095* (2013.01); *G03F 7/26* (2013.01); *Y10T 428/24802* (2015.01)

(58) Field of Classification Search
CPC ......... G03F 7/2022; G03F 7/203; G03F 7/26; H01L 21/027
USPC ......................................... 430/311, 328, 394
See application file for complete search history.

(56) References Cited

U.S. PATENT DOCUMENTS

| | | | |
|---|---|---|---|
| 5,459,013 A | 10/1995 | Berry | |
| 5,798,203 A | 8/1998 | Haraguchi | |
| 6,042,998 A | 3/2000 | Brueck | |
| 6,544,721 B1 | 4/2003 | Saitoh | |
| 2006/0204903 A1* | 9/2006 | Choi et al. | 430/321 |
| 2009/0265680 A1* | 10/2009 | Izuha et al. | 716/21 |

* cited by examiner

*Primary Examiner* — Kathleen Duda
(74) *Attorney, Agent, or Firm* — Whitham Curtis Christofferson & Cook, PC

(57) ABSTRACT

Multiple patterned exposures of a single layer of image reversal resist prior to and following image reversal processing, upon development, respond to the respective exposures as either a positive or a negative resist, allowing a desired shape of a resist structure to be built up from any of a number of combinations of primitive masks. Exploiting the image reversal resist in this manner allows several types of diffraction distortion to be entirely avoided and for many sophisticated lithographic processes to he reduced in complexity by one-half or more while any desired resist structure shape can be formed form a limited number of primitive mask patterns. A regimen, which may be automated as an executable algorithm for a computer may be followed to evaluate different combinations of masks which are valid to produce a desired resist structure shape and select the optimum mask pattern combination to do so.

20 Claims, 21 Drawing Sheets

Figure 1:
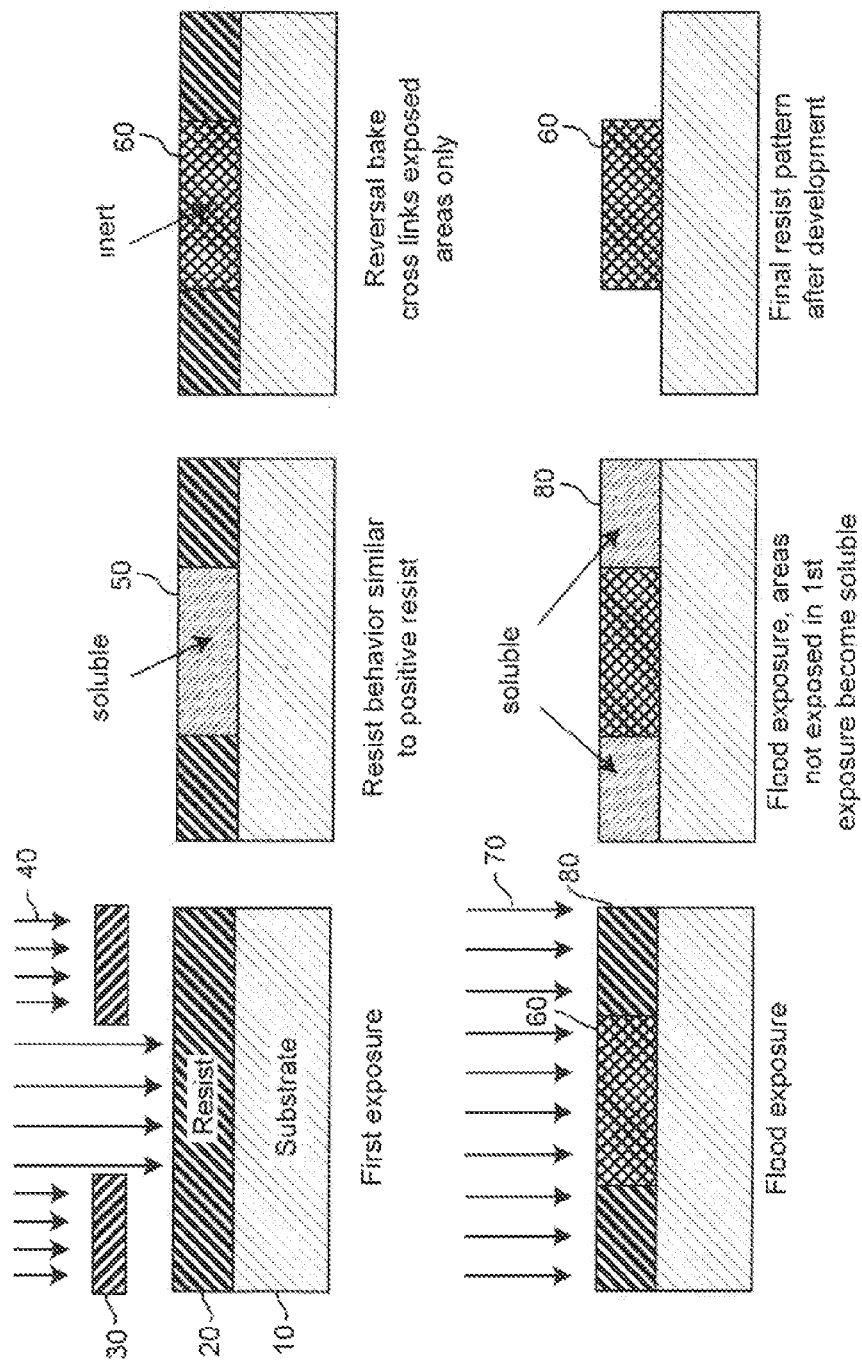

| MASK | | PR | |
|---|---|---|---|
| Opaque | Transparent | Insoluble | Soluble |
| 0 | 1 | 0 | 1 |

| Mask 1 (A) | Mask 2 (B) | Initial mask (C) |
|---|---|---|
| 0 | 0 | 0 |
| 0 | 1 | 1 |
| 1 | 0 | 0 |
| 1 | 1 | 0 |

*Figure 24*

MULTIPLE EXPOSURE WITH IMAGE REVERSAL IN A SINGLE PHOTORESIST LAYER

CROSS-REFERENCE TO RELATED APPLICATIONS

This application claims benefit of priority of PCT Application PCT/US11/47054 filed Aug. 9, 2011, designating the United States, and U.S. Provisional Applications 61/371,890, filed Aug. 9, 2010, 61/383,580, filed Sep. 16, 2010, and 61/446,707, filed Feb. 25, 2011, all of which are hereby incorporated by reference in their entireties.

FIELD Of THE INVENTION

The present invention generally relates to lithographic processes and, more particularly, to high resolution, high fidelity lithographic processes for semiconductor device manufacture of reduced cost.

BACKGROUND OF THE INVENTION

The demand for higher operating speeds and increased functionality of semiconductor integrated circuit devices have driven designs to extreme integration densities and extremely small minimum feature sixes near the limits of lithographic mask image resolution, principally due to diffraction distortion effects, and the capability of lithographic processes to produce structures with adequate shape fidelity to the lithographic resist exposure to avoid significant chip-to-chip variation in electrical characteristics or reliability. Smaller electronic element (e.g. transistors) size and increased proximity allows higher circuit density and often requires operation at reduced voltages and currents which reduces power consumption and allows more devices to be fabricated on a single chip of given dimensions and lithographic process costs while increased proximity of electrical elements reduces signal propagation time and reduces susceptibility to noise.

This same demand has necessitated the development of numerous sophisticated lithographic exposure processes in order to extend the limits of lithographic resolution and shape fidelity of lithographic processes. For example, lithographic resists have been developed which can be exposed by energy of very short wavelengths such as ultraviolet light, X-rays and electron beam exposures in order to increase resolution. So-called phase shift masks have also been developed to provide a degree of control over diffraction distortion effects. Masks having "pre-corrected" shapes have also been developed to more accuracy produce intended shapes at sizes where diffraction distortion effects occur and are referred to as optical proximity correction (OPC) masks. Additionally, several techniques have been developed for multiple exposures of one or more resists, sometimes in conjunction with a so-called hard mask, that have achieved some degree of success in improving lithographic exposure resolution and/or fidelity but which do so at the expense or increased process/complexity and cost; significantly for the design and preparation of multiple masks for the respective exposures. Further* each of the multiple exposures is subject to registration or "overlay" errors which can compromise manufacturing yield.

Image reversal resists are also Known and provide some degree of improvement in image fidelity. Essentially, image reversal resists: cause initially exposed areas soluble and subject to development in the manner of a normal positive resist. However, if the exposed resist is then balked instead of being developed, the initially exposed areas become substantially inert due to cross-linking that occurs during the baking process while leaving unexposed areas unaffected. If the resist is exposed again with an unpatterned, so-called "flood" exposure, the initially-unexposed areas become soluble and can be developed and removed in the normal manner with a suitable developer; leaving the initially exposed areas of the resist, which have been rendered inert by the baking process, in place; a result similar to the use of a negative resist but with improved properties of resistance to many lithographic processes and thus capable of producing improved shape fidelity of the structures formed by those lithographic processes. Known commercially available image reversal resists include AZ 5214E, TI 35E, TI 35ES, Ti Plating, TI xLift, TI Spray and AZ nLof 2070, all of which are available from Clariant AZ Electronic Materials Corp.

SUMMARY OF THE INVENTION

It is therefore an object of the present invention to provide a technique for using multiple exposures of a single layer of image reversal resist which provides increased resolution and shape fidelity as well as mitigation of diffraction distortion while providing reduced process complexity and reduced cost, even in cases where no increase in image fidelity is needed, and substantially avoiding a need for optical proximity correction (OPC).

It is another object of the invention to provide a lithographic technique allowing complex shapes to be created using a reduced number of masks.

It is a further object of the inversion to provide a technique of mask-design decomposition to provide optimal exposure resolution and shape fidelity while mitigating diffraction distortion effects and minimizing the required number of primitive masks for producing an arbitrary lithographic exposure.

In order to accomplish these and other objects of the invention, a lithographic process is provided comprising steps of applying an image reversal resist to a surface, performing a first patterned exposure to expose a selected area of the image reversal resist using a first mask, performing image reversal processing of the image reversal resist, performing a second patterned exposure to expose another selected area of said image reversal resist using a second mask subsequent to the image reversal processing, and developing the image reversal resist.

In accordance will another aspect of the invention, a method of selecting an optimal combination of masks for producing a desired resist structure shape is provided comprising steps of determining a combination of mask patterns which is valid, in combination, to produce a desired resist structure shape, counting corners in each of the mask patterns of a valid combination of mask patterns to produce the desired resist structure shape, combining numbers of corners counted -in each mask of the combination to derive a figure of merit, and selecting a combination of mask patterns having a minimum value of the figure of merit.

In accordance with a further aspect of the invention, a structure is provided including a substrate or layer of material having a surface, a layer of image reversal resist having been exposed by a patterned exposure in selected areas and subjected to image reversal processing and another patterned exposure such that the selected areas of the layer of image reversal resist exposed by the patterned exposure, upon development, respond to the patterned exposure as a negative resist and areas of the layer of image reversal resist not exposed by another patterned exposure, upon development, respond to that patterned exposure as a positive resist.

BRIEF DESCRIPTION OP THE DRAWINGS

Figure 2:
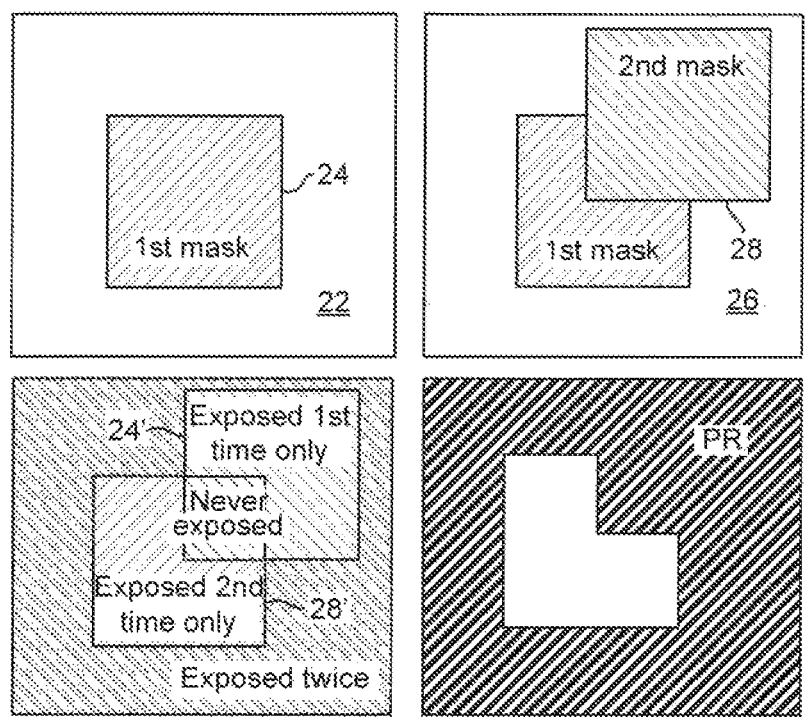
Figure 6:
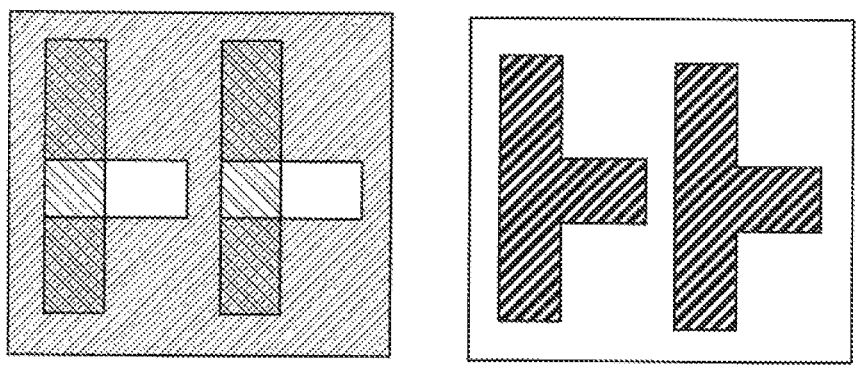
Figure 7:
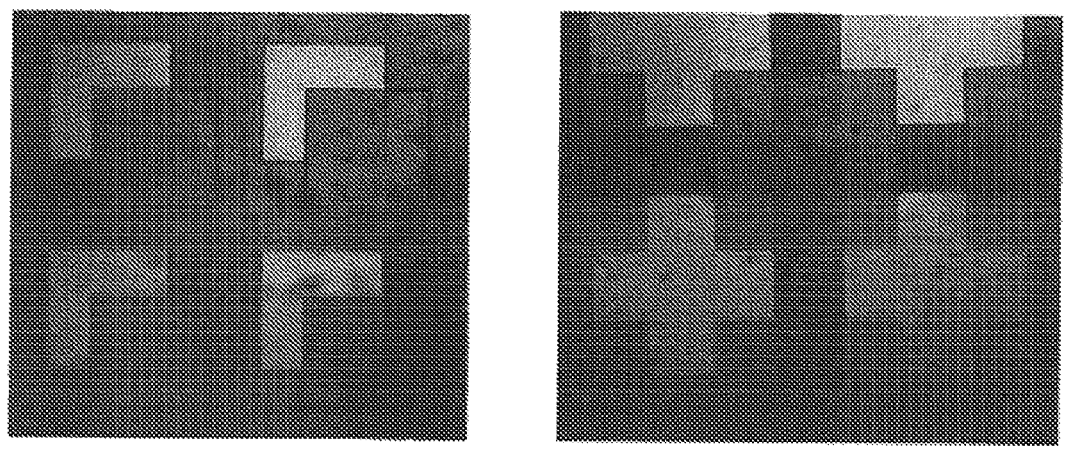
Figure 8:
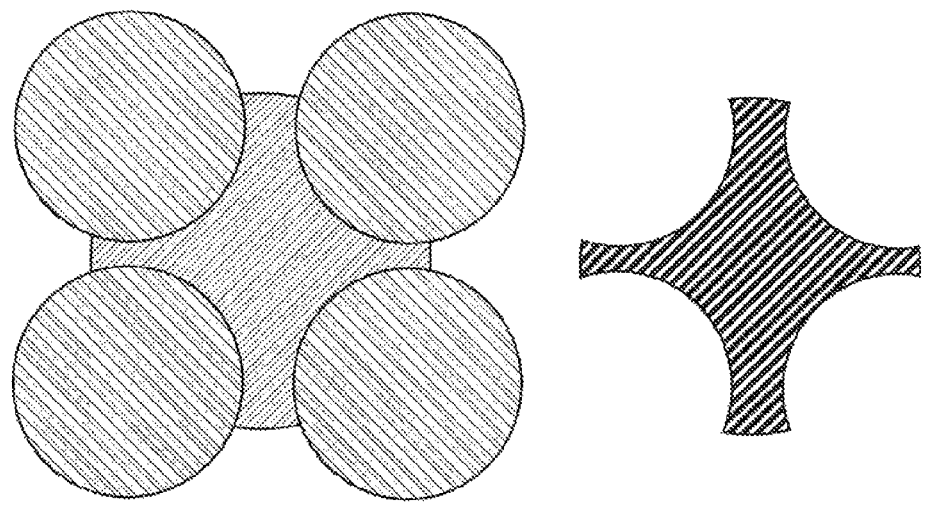
Figure 11:
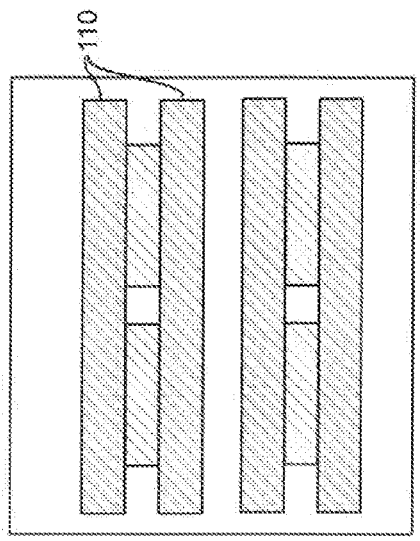
Figure 10:
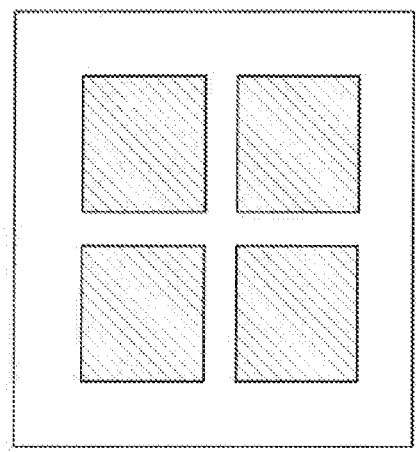
Figure 13:
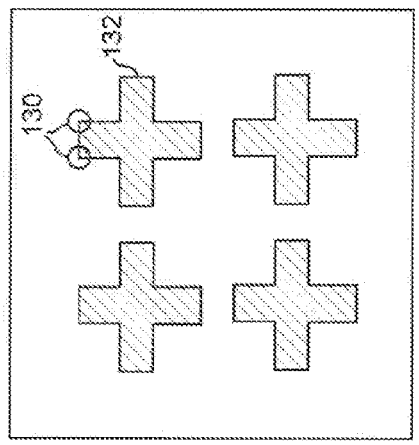
Figure 14:
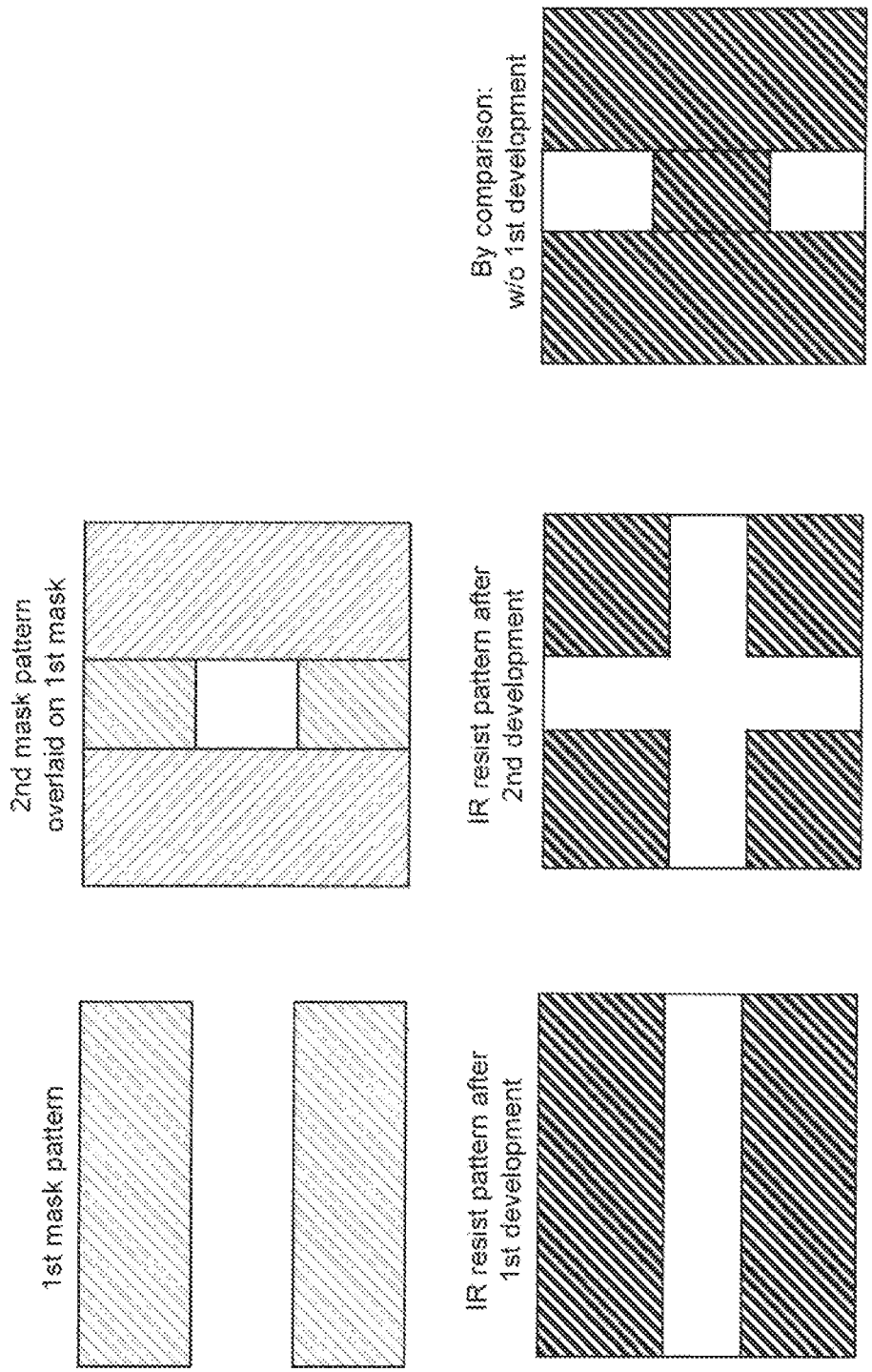
Figure 15:
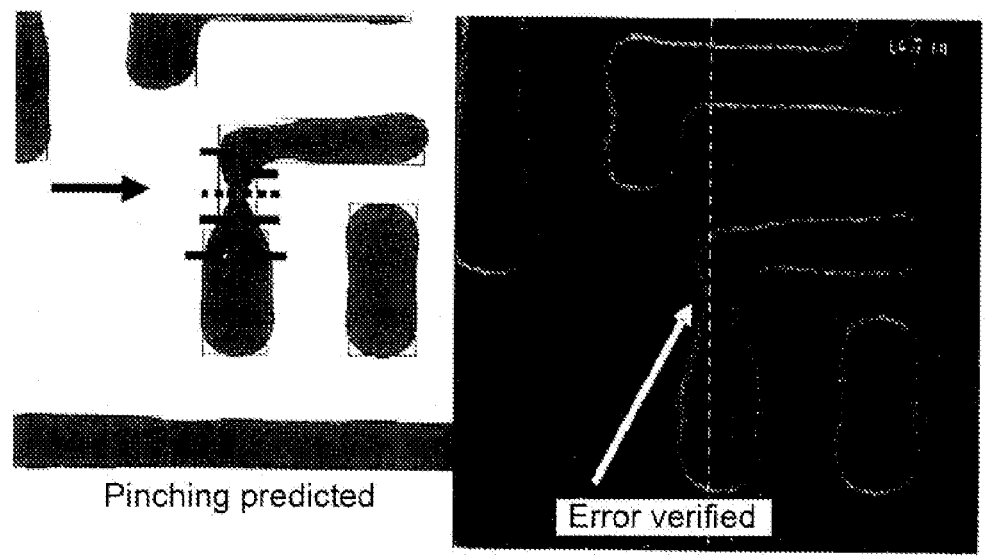
Figure 16:
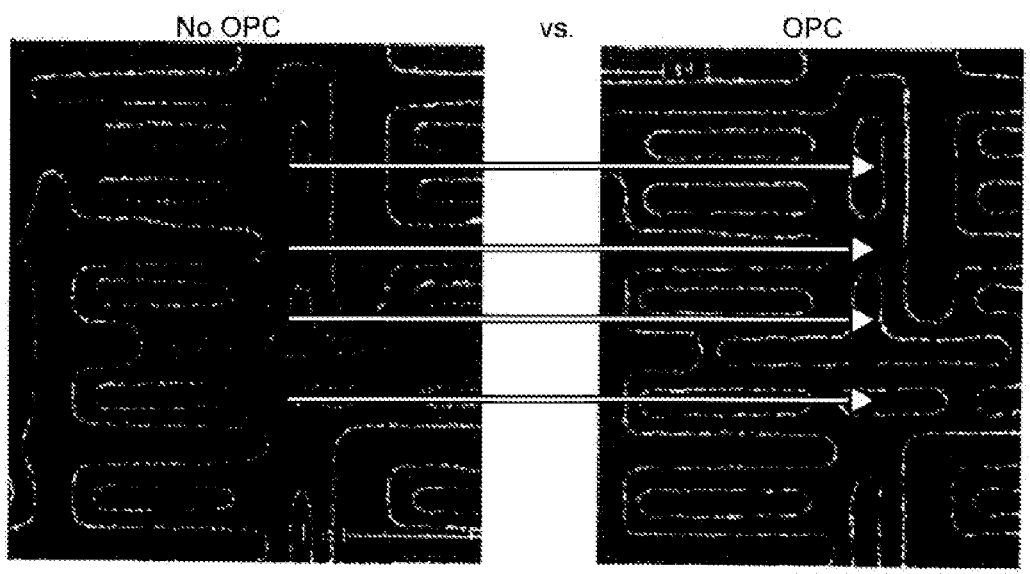
Figure 19:
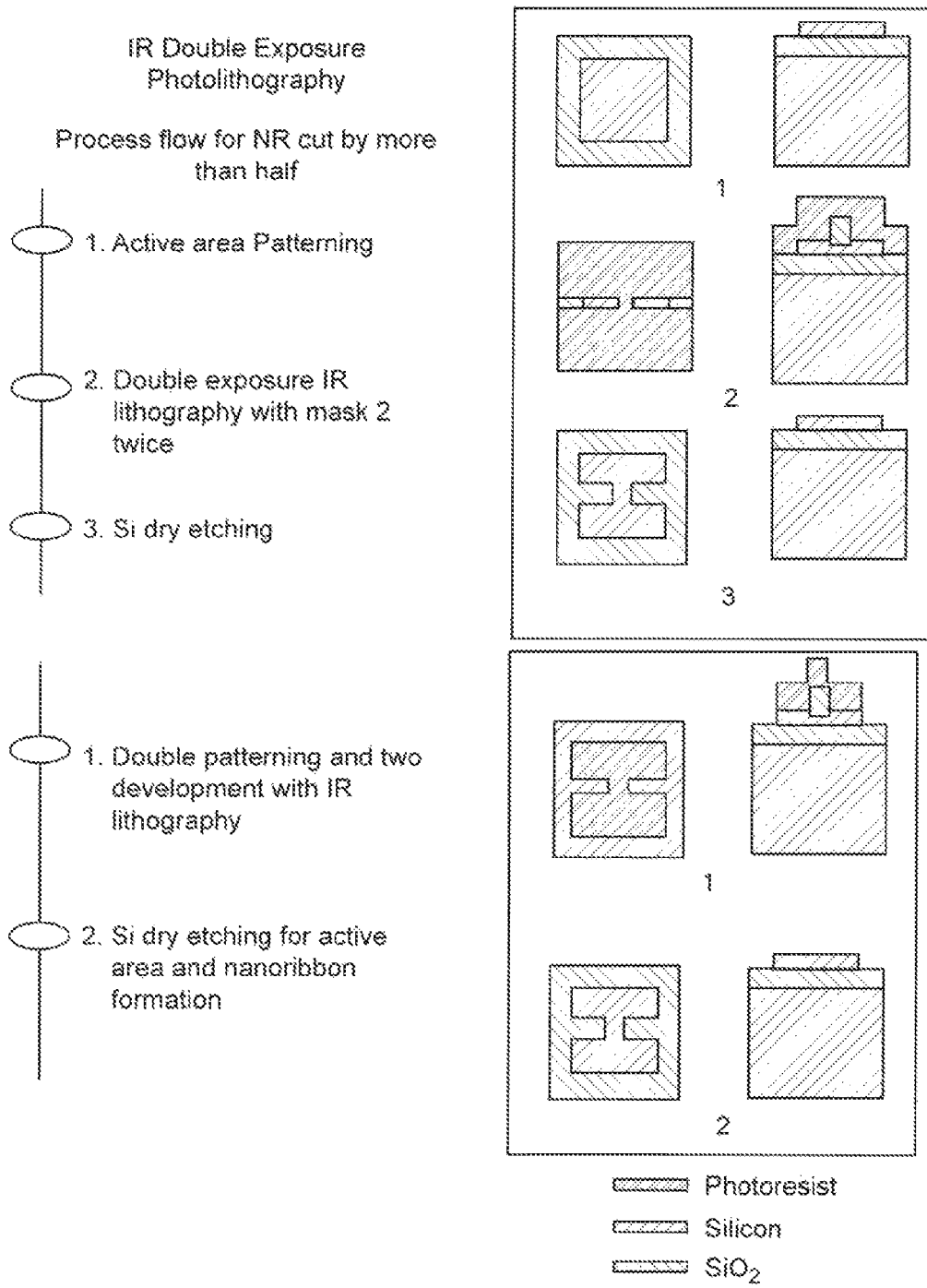
Figure 20:
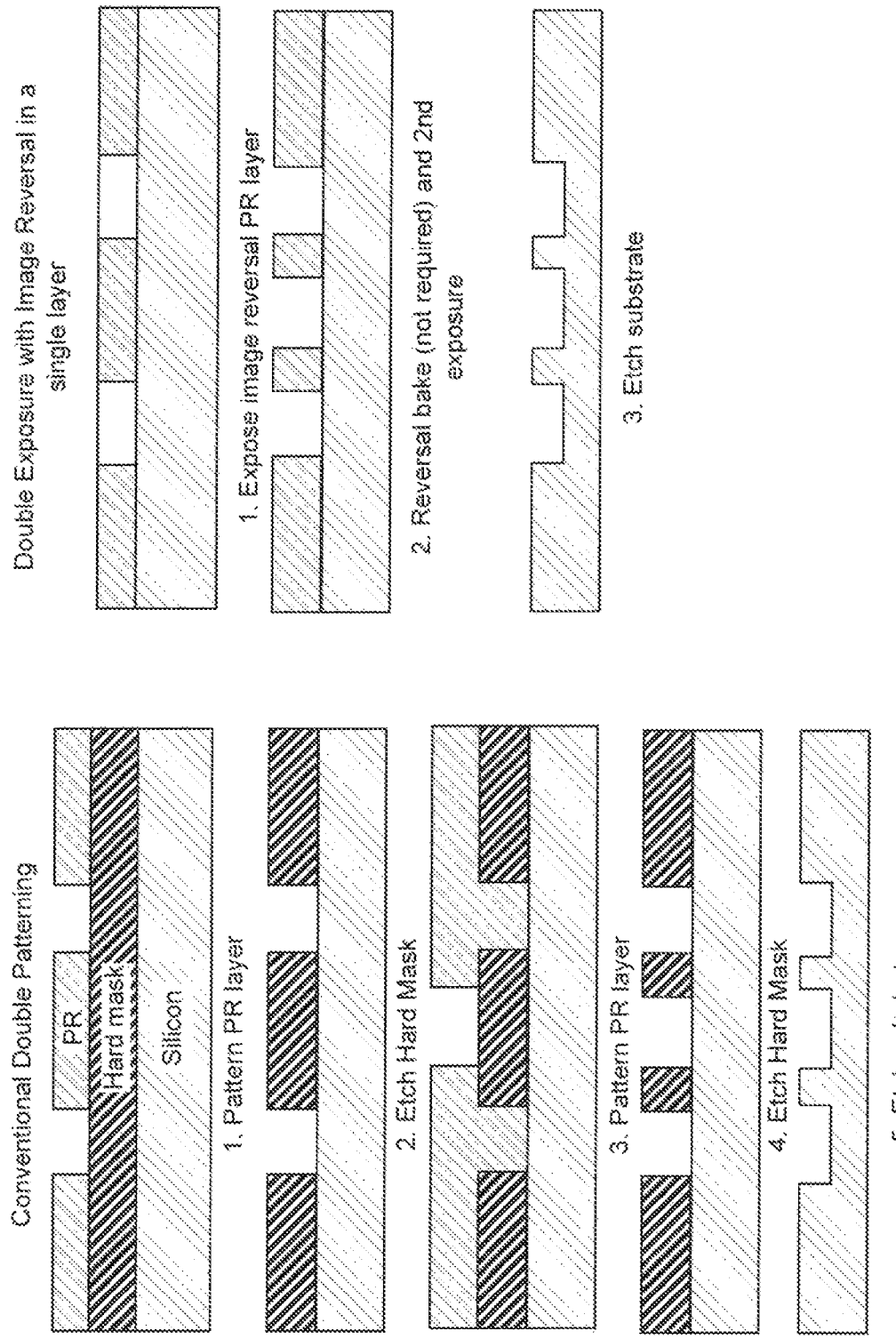
Figure 21:
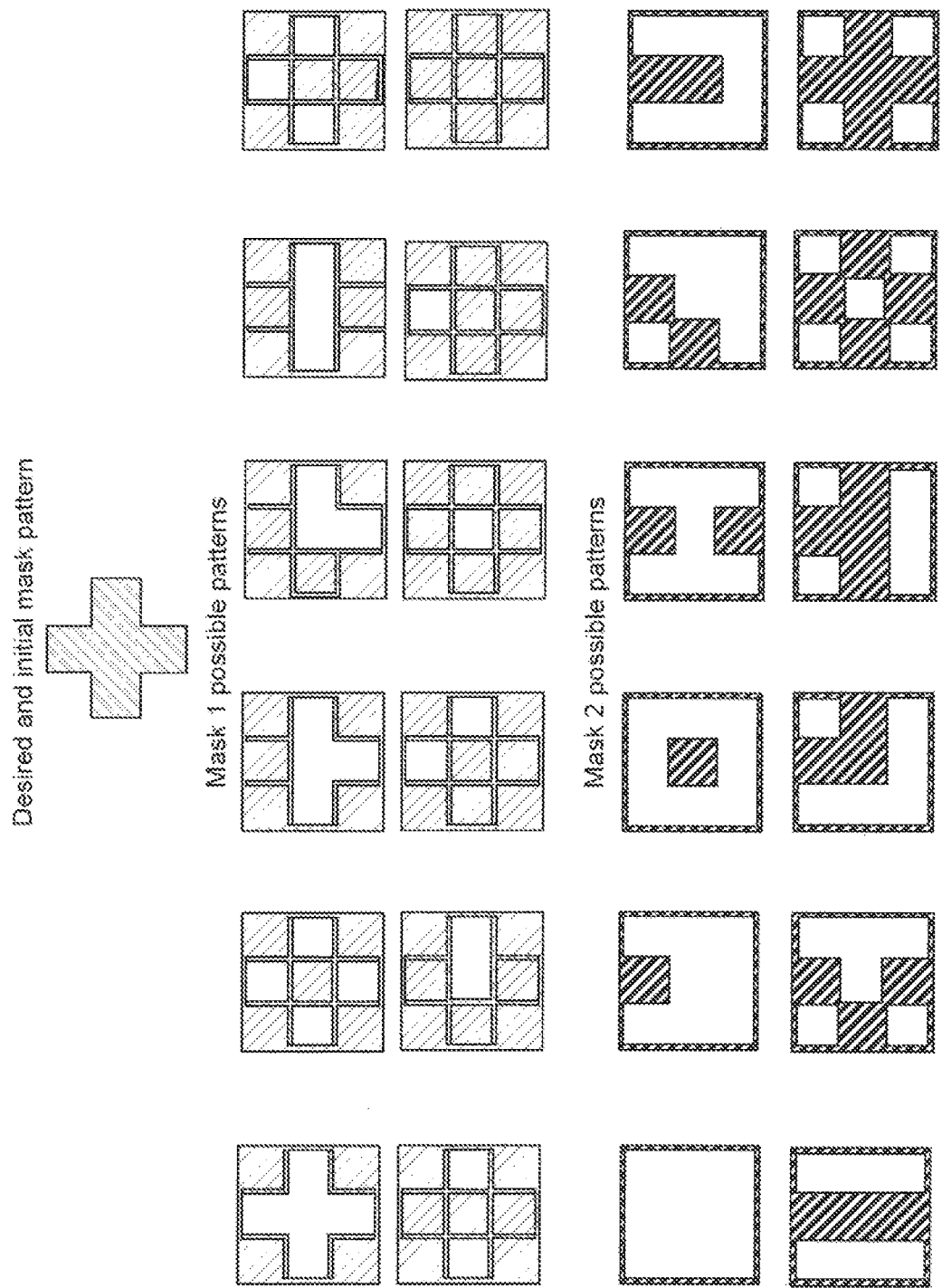
Figure 22:
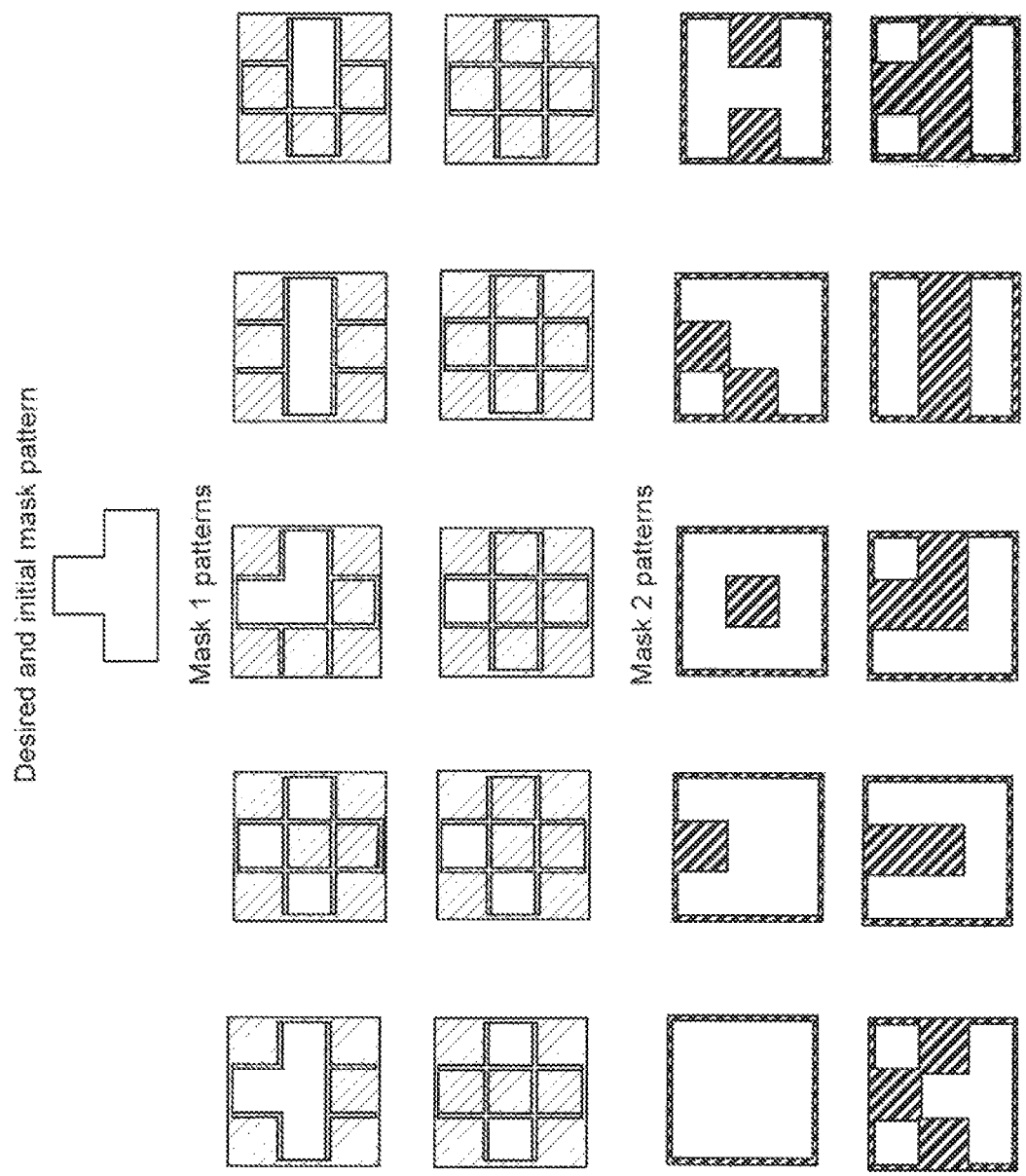
Figure 23:
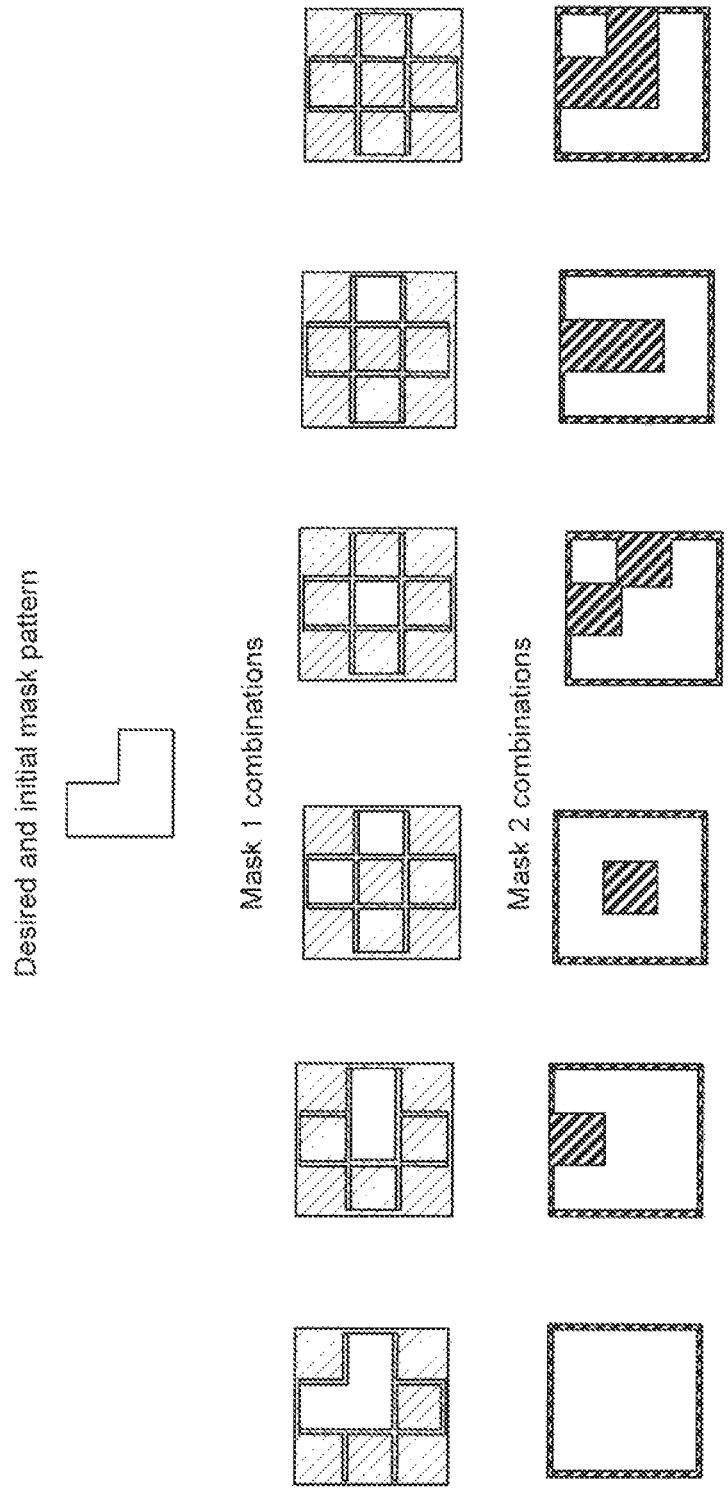
Figure 25:
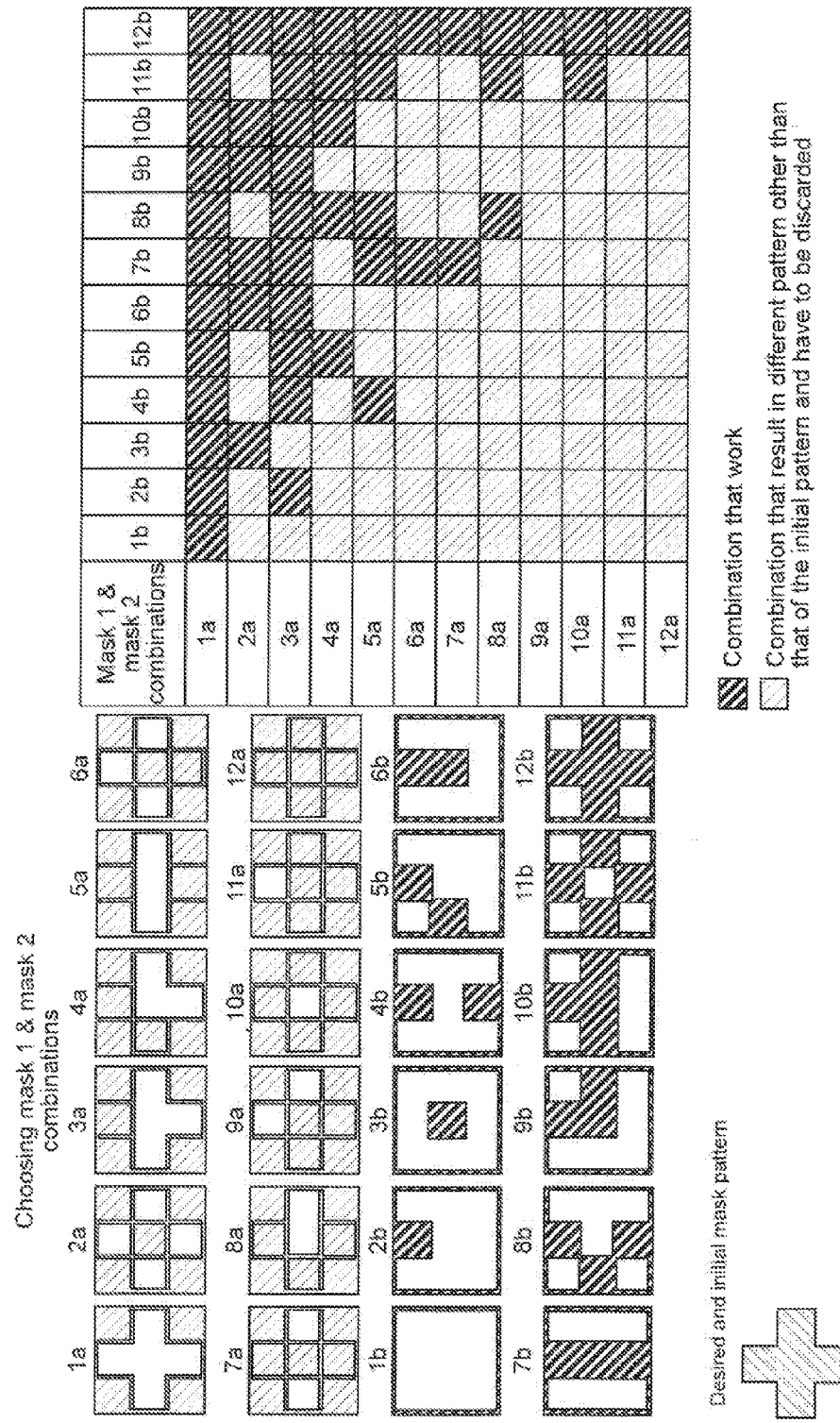
Figure 26:
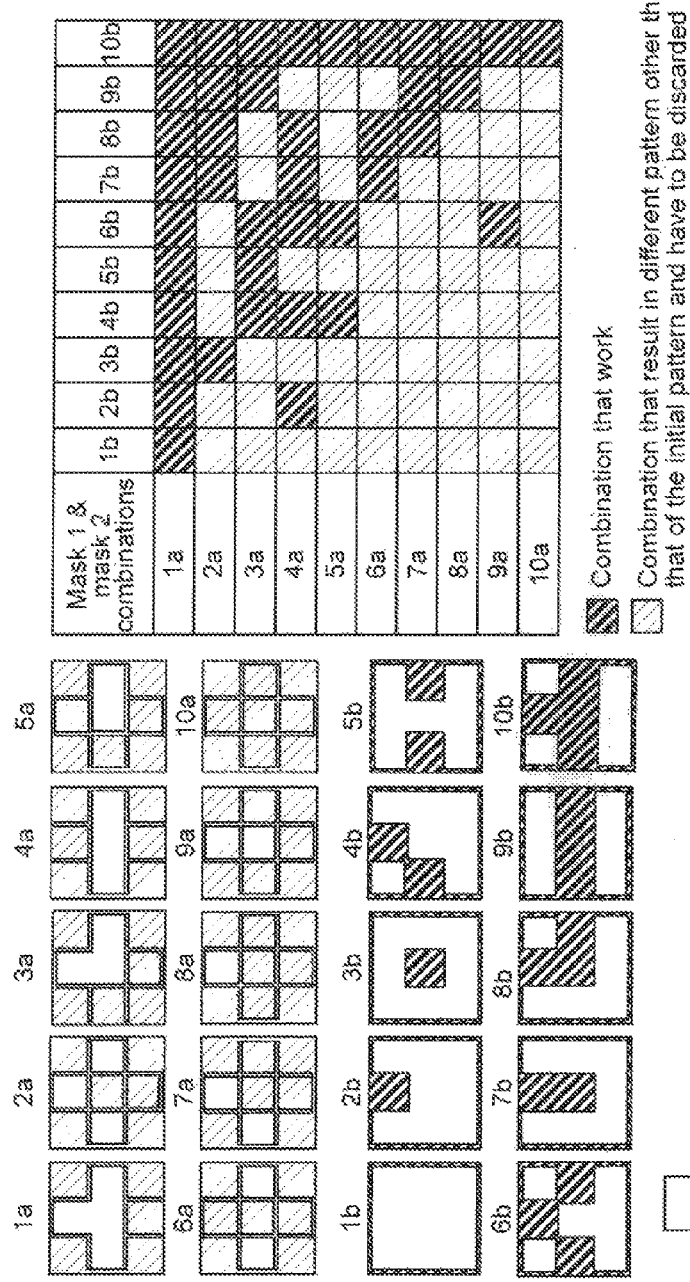
Figure 27:
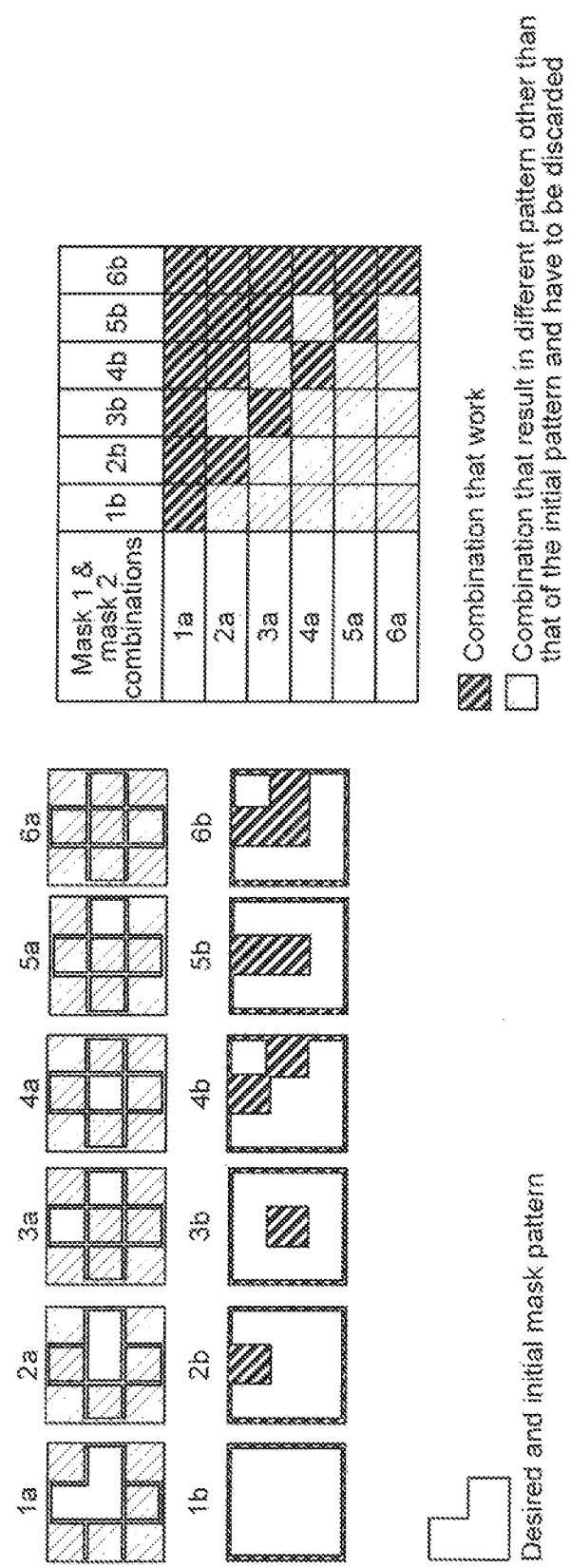
Figure 28:
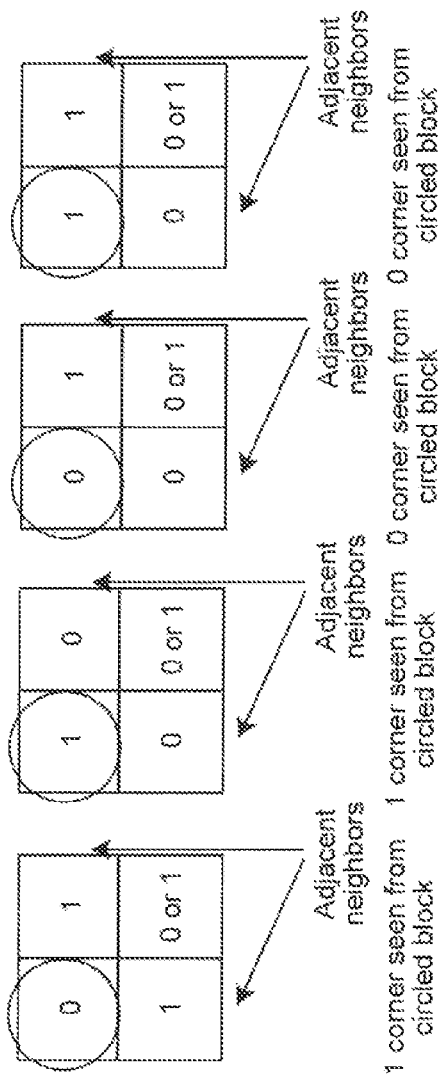
Figure 29:
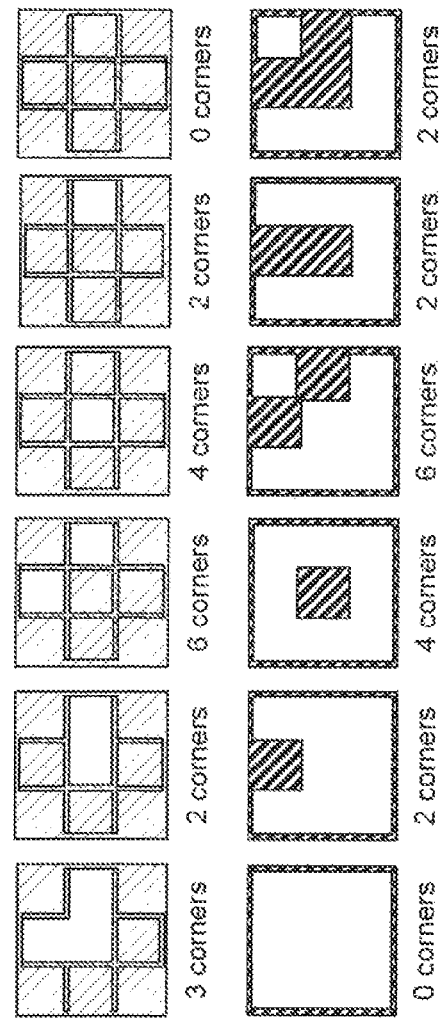
Figure 30:
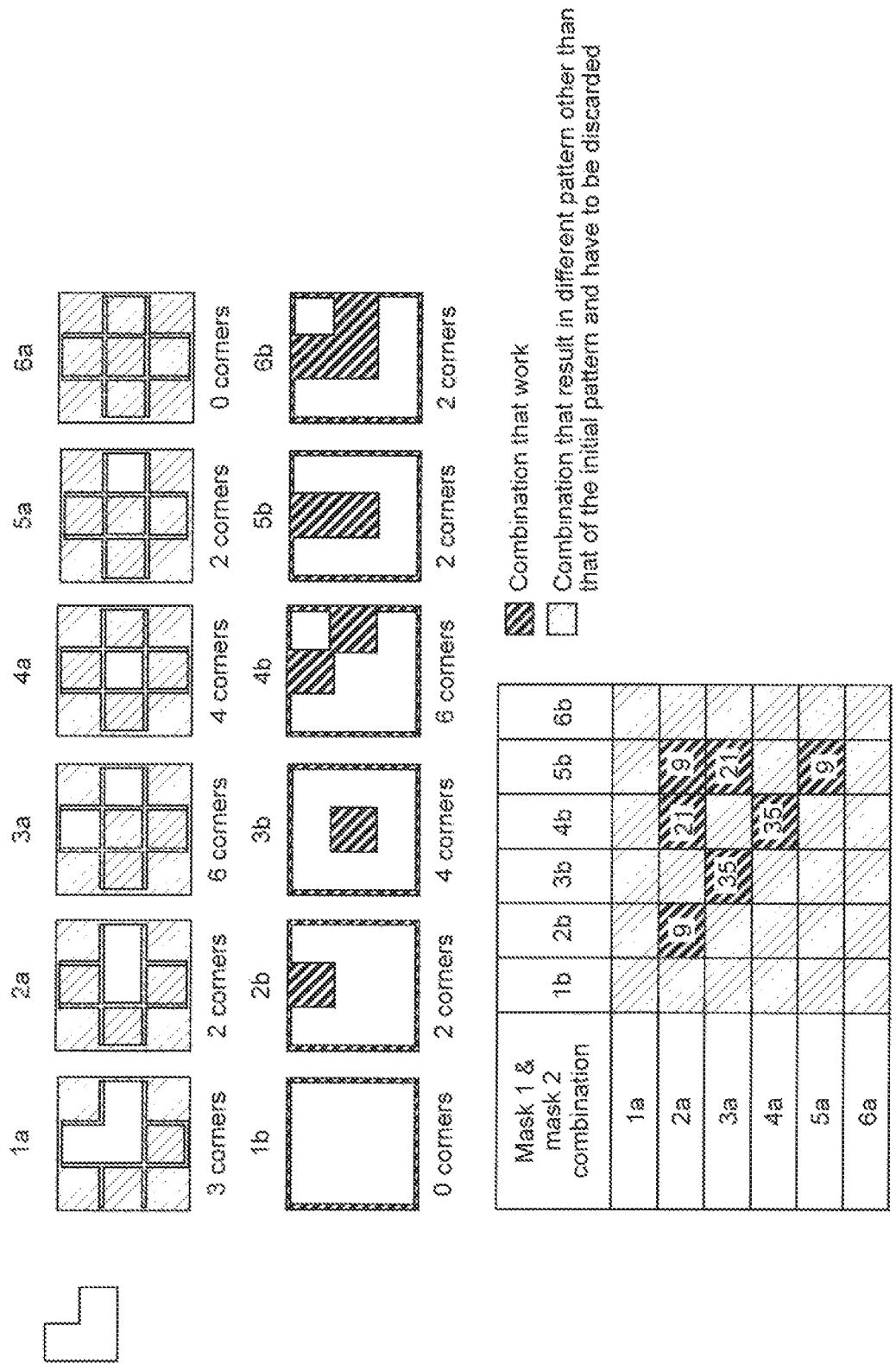
Figure 31:
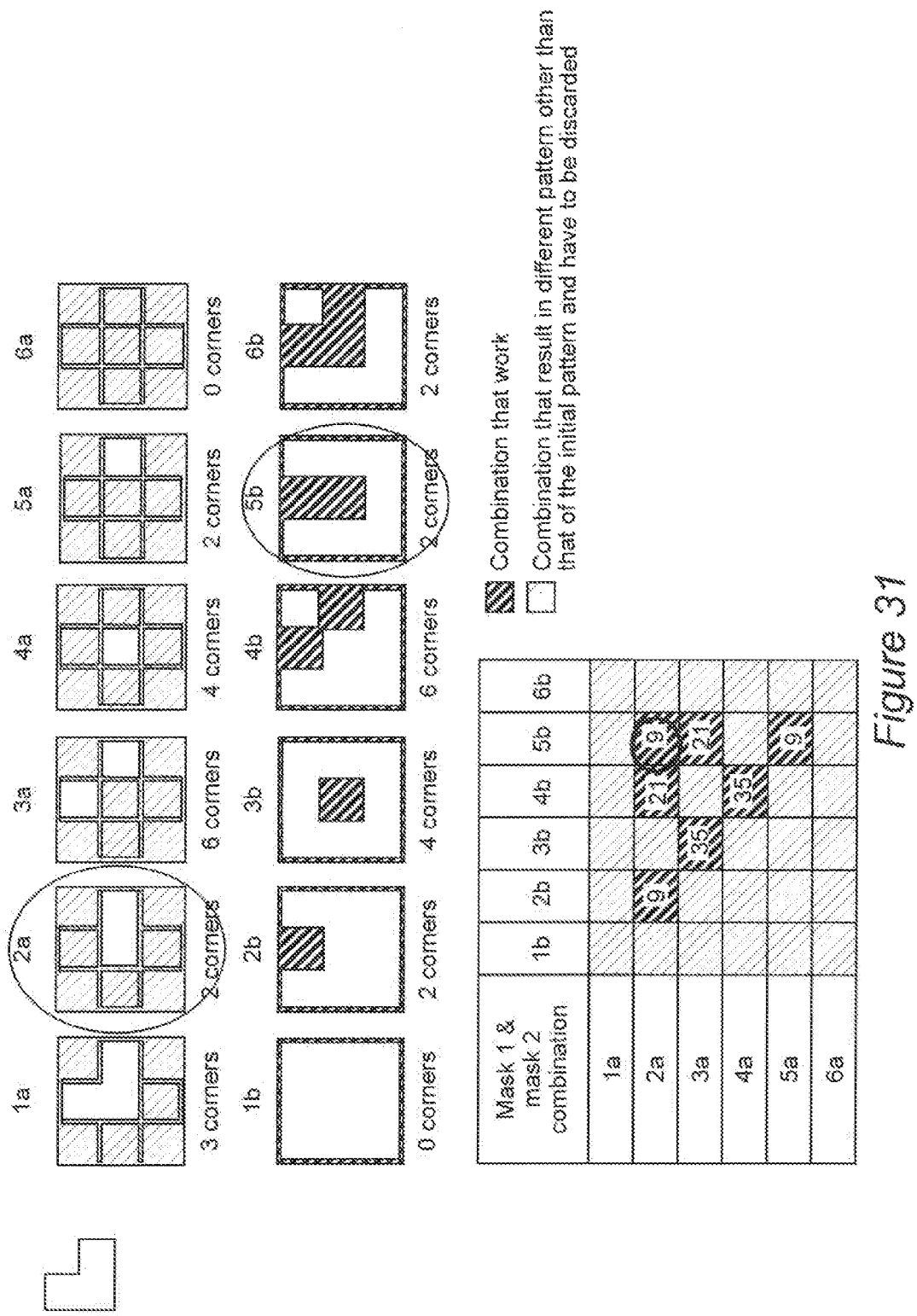

The foregoing and other objects, aspects and advantages wilt be better understood from the following detailed description of a preferred embodiment of the invention with reference to fee drawings, in which:

FIG. 1 is a sequence of cross-sectional views of a substrate covered by a resist illustrating a known method of using image reversal resists, FIG. 2 is a sequence of plan views of mask patterns and corresponding resist exposure patterns in accordance with the basic principles and practice of the invention, FIGS. 3, 4, 3, 6 and 7 are illustrative examples of use of two masks in different, ways to develop particular exemplary resist pattern structures, FIG. 8 illustrates a generalization of the basic principles of the invention through use of composite masks formed of combinations of primitive masks, FIGS. 9, 10, 11, 12 and 13 arc a sequence of plan views of an image reversal resist, illustrative of a variant embodiment of the invention, FIGS. 14, 15 and 16 illustrate the effectiveness of the invention to greatly reduce several prevalent types of distortion produced by known lithographic techniques, FIGS. 17, 18, 19 and 20 illustrate use f the invention, to form a variety of exemplary semiconductor device structures, FIGS. 21, 22 and 23 illustrate an image decomposition phase of a perfecting feature of the invention to choose the optimal primitive masks to produce an optimal patterned resist structure for a given application, FIG. 24 illustrates detection of valid combinations of masks in a selection phase of the perfecting feature of the invention, FIGS. 25, 26 and 27 illustrate tabulation of valid mask combinations detected in the manner depicted in FIG. 24, FIGS. 28 and 29 illustrate a preferred method of corner counting as part of the selection phase of the perfecting feature, and FIGS. 30 and 31 as well as FIG. 25 illustrate selection based on a figure of merit and selection between mask combinations yielding equal figures of merit.

DETAILED DESCRIPTION OF A PREFERRED EMBODIMENT OF THE INVENTION

Referring now to the drawings, and more particularly to FIG. 1, there is shown a sequence of crass-sectional views of a substrate covered by a resist and illustrating a known method of using image reversal photoresists (PRs). It should be understood that known image reversal photoresists (PR) are generally sensitive to Ultra-violet and short wavelength visible light but other materials possibly usable as image reversal resists that can be exposed by shorter wavelengths and other forms of energy (e.g. deep ultraviolet light, X-rays, electron beams and the like) are known and are foreseeable. Some such materials may not be identified as image reversal resists but may include a baking step or some intermediate development step that selectively alters energy sensitivity based on a prior exposure in a specified suitable development process and are thus likely to function as an image reversal resist. Therefore, the term "resist" will be used hereinafter to be inclusive of not only photoresists but all materials which can be differentially developed depending upon whether or not particular areas thereof have been exposed to a particular form of energy. The abbreviation "PR" as may be used hereinafter and in the drawings should also be understood as being inclusive of all materials referred to by the term "resist" and are not limited to photoresists as the abbreviation might otherwise imply. Also, as a matter of convenience in terminology, terms like "exposed area" and "mask pattern" or the like refers to areas of a resist which is exposed by a given lithographic patterned exposure since the area where exposure is effective to cause differential development may not precisely correspond to a pattern in a mask (either due to the common practice of demagnification of a pattern formed in a mask or alteration of the mask from the desired final lithographic pattern to correct for optical proximity effects or the like) but should be understood as applicable to an unexposed area in regard to an opposite type of resist.

As is well-known in the art, conventional resists may be of either positive or negative type. With positive type resists, the exposed area becomes soluble and is removed during development. Unexposed areas of a positive resist are unaffected by development other than usually being rendered insensitive to further exposure. Conversely, with negative type resists die unexposed portion becomes soluble and is removed during development. Exposed areas of a negative resist are generally unaffected by development. That is, positive and negative resists exhibit opposite and complementary behaviors in regard to exposure to energy. However, since exposure dose is cumulative, some differences in resulting patterns may be observed due to variation in exposure dose resulting from diffration effects, phase shift masks or the like which may favor use of either a positive or negative resist in a particular application. Thus, conventional single exposure lithography forms a pattern generally in accordance with a pattern formed in a mask used during the single exposure and the accuracy thereof will be determined by the resolution of the exposure system.

As alluded to above, several multiple exposure lithographic techniques have been developed to extend the capabilities of conventional,, resolution-limited single exposure techniques. A first of these techniques is double exposure lithography (DEL) which involves the exposure of a single layer of positive or negative resist with two or more exposures through slightly differing masks such that diffraction effects due to each respective mask cause a particularly sharp gradient at the intended edge of a feature to be formed in the resist image due to the cummalative nature of the resist exposure. In other words, the diffraction effects, where the interference pattern due to diffraction at the edges of the mask cause peaks and valleys (diminishing in magnitude with distance from the edge of the intended features) in exposure energy flux beyond the edges of the intended feature shape. The use of (partial) exposure with two or more slightly differeing masks (e.g. with differing feature sizes and/or using phase shift structures and the like) can be designed such that the larger peaks in exposure energy flux from one exposure generally coincide with valleys in exposure flux from another exposure to a distance from the intended feature edges where exposure energy flux will be ineffective to cause exposure of the resist. Thus DEL allows potentially improved fidelity of resist patterning beyond the limits of resolution of conventional single exposure lithography. However, such an improvement is, itself, limited by the degree of non-linear response to exposure dose which is exhibited by the resist employed arid resist materials exhibiting a sufficiently non-linear response to exposure dose to obtain more than a slight improvement in shape fidelity are relatively expensive. This technique is not required by the invention but may be potentially used together with the invention to further marginally improve shape fidelity at very small feature sixes which is enhanced by the invention as will be discussed in greater detail below.

Another multiple exposure lithographic technique is referred to as double patterning lithography (DPL). This technique is useful for developing increased pattern density beyond that which can be accomplished using conventional, resolution-limited single exposure lithography (or DEL, which requires sufficient feature separation for the variation in exposure flux to diminish with distance from the edges of intended features below a level which will cause resist exposure). Specifically, closely spaced features can be formed by exposing widely spaced features in a first resist layer, transferring the pattern to a hard mask, removing the first resist layer, applying another layer of resist, exposing further features interleaved with the previously exposed features, transferring the further features to the hard mask, removing that layer of resist and so on until all desired features are formed in the hard mask. The pattern thus formed in die hard mask can then be transferred to the substrate or other underlying layer. However, it can readily be appreciated that this technique, while useful in appropriate applications, requires dramatically increased process complexity and process time as well as being subject, at many junctures, to overlay errors and the like which can greatly compromise manufacturing yield. This technique is important to an understanding of the invention only insofar as the invention can reduce the complexity of forming closely spaced features by at least one-half compared with DPL and with substantially reduced susceptibility to overlay errors.

Returning now to FIG. 1, a plurality of cross-sections of an exemplary substrate or layer of material 10 covered by an image reversal resist 20 are shown. The upper left cross-section illustrates an exemplary mask 30 and a conventional lithographic exposure 40 through a pattern formed in the mask. The upper central cross-section thus indicates exposed region 50 which, if development of the resist were to be performed at this point, would become soluble and would be removed as would be the case for conventional single exposure lithography using a positive resist alluded to above. However, as shown in the upper right cross-section, the resist is bated for a duration and at a temperature appropriate to the particular image reversal resist causing exposed resist 50 to become cross-linked and inert as indicated at 60. Then, at the lower left cross-section a flood exposure of the entire resist layer is performed; rendering exposed regions soluble upon development while the exposure of inert region 60 has no effect and region 60 remains inert, as shown in the lower central cross-section. Finally, as shown in the lower right cross-section, the image reversal resist is developed and removed leaving region 60 inkjet. This result is much the same as if a negative resist had been initially employed in the initial exposure and development in the upper left and upper central cross-section of FIG. 1 due to the image reversal However, the remaining resist region 60 may have more useful chemical properties for some applications since it was rendered inert rather than merely undeveloped.

Other relatively sophisticated lithographic techniques such as doable dipole lithography (DDL), use of trim masks with alternating phase shift masks, and so-called innovative double exposure by advanced lithography (IDEAL) are known and can: be used in combination with the invention to marginally improve effective resolution and/or resist shape fidelity. However, details of these techniques are not important to the successful practice of the invention, in accordance with its basic principles and variations thereof as will be discussed below. Rather, most of these techniques are complex, time-consuming and/or costly and the improvements in effective resolution and shape fidelity provided by the invention, particularly in regard to rounding of convex outside corners and distortion at concave inside comers, will avoid the necessity of using such techniques in most applications.

Referring now to FIG. 2, the invention will now be explained in connection with its most basic principles. The inventors have realized that the area of an image reversal resist not exposed by the patterned mask, after baking, remains photosensitive and continues to function as a positive resist. The inventors have further realized that the exposed areas of an image reversal resist which is rendered inert by baking has the equivalent manifestation as if the exposure had been made of a negative resist. Therefore, in the image reversal resist, exposure followed by baking causes the exposed area to respond to the exposure as a negative resist and can be used as such in combination with, a positive resist in the same layer that remains sensitive to further patterned exposure. The invention exploits these properties of an image reversal resist to build up a desired pattern by two (or more) patterned exposures; one being a patterned exposure of a positive resist and the other being the equivalent manifestation of a patterned exposure of a negative resist while both exposures are performed in the same resist layer. This building up of desired patterns from two exposures not only provides for the possibility of limiting the mask patterns to a relatively small number of primitive mask patterns but also provides some unexpected benefits in improving resolution and fidelity of the resist structure but provides substantial arid unexpected simplification of processes previously required to achieve some qualities of desired patterns such as increased feature density even in cases where improvement in resolution or image fidelity may not be required.

FIG. 2 illustrates, in plan view, four arbitrary rectangular regions of a mask or an image reversal resist on a substrate similar to the cross-sectional views of FIG. 1. That is, the areas indicated by the bounding rectangles 20 do not necessarily correspond to the same physical area but: are chosen for clarity of illustration. In the upper left rectangle, a first mask 22 is illustrated with a pattern shown as a shaded rectangular area 24 with the shaded portion corresponding to an area substantially opaque to the exposure energy. The upper right rectangle additionally shows a second mask 26 (which may be a physically different mask from mask 22 or the same mask 22 translated in position), having an opaque rectangular pattern 28. The lower left rectangle 20 illustrates a first exposure 24 made with the first mask 22. Following an image reversal process (e.g. baking) a second exposure 28 is made; the area of which overlaps the pattern area of the first exposure. These two overlapping patterned exposures yield areas of four different exposure conditions: area exposed only by the first exposure, area exposed only by the second exposure, area exposed by both exposures (where the exposures overlap) and area which is unexposed. These four exposure states are not produced in the normal processing of image reversal resists discussed above in connection with FIG. 1 since in conventional lithography using an image reversal resist, the second exposure is an unpatterned, flood exposure and does not contribute to the final image or allow for an exposure state of never exposed or exposed only by die first exposure. Thus, area never exposed, area exposed by the first exposure and area exposed twice, upon development are all insoluble and are not removed while area exposed only by the second exposure following the image reversal process will be developed as: shown in the lower right rectangle 20.

There are several important observations to be made from FIG. 2 and the above discussion which will facilitate an appreciation of the capabilities and meritorious effects of the invention. Initially, it is to be rioted that the resist pattern produced is a substantially more complex shape than the shapes in either of the masks used to produce it since the resulting resist pattern includes a concave edge portion or so-called "inside corner" which is known to be difficult to accurately produce. Further, the masks have only straight edges that are perpendicular to each other. Additionally, the mask patterns are all rectangular and no mask patterns having inside comers need be used In order to produce a resist structure having an inside corner in accordance with the invention since and arbitrary resist shape car be built up front rectangles In accordance with the invention although use of more complex mask shapes are deemed to be within the scope of the present invention. This capability of the invention is of substantial importance in avoiding or reducing diffraction distortion effects, particularly at small feature sizes, as will be discussed in greater detail below.

Perhaps less evidently, the remaining resist is comprised of areas having no exposure, single exposure using the first mask or double exposure. All three of these exposure conditions produces the same effect on the image reversal resist. This, in turn, implies that virtually any shape can be developed in several alternative ways using masks of different shapes and, moreover, any desired resist structure shape can be built up from a limited number of primitive mask shapes and each of the primitive mask shapes can be achieved using a limited number of primitive masks while there will be several alternatives for combinations and sequences of primitive masks that will result in a given primitive mask shape. The desired resist structure shape can also be built up of a limited number of shapes that -may also be referred to as primitive resist structure shapes.

Figure 3:
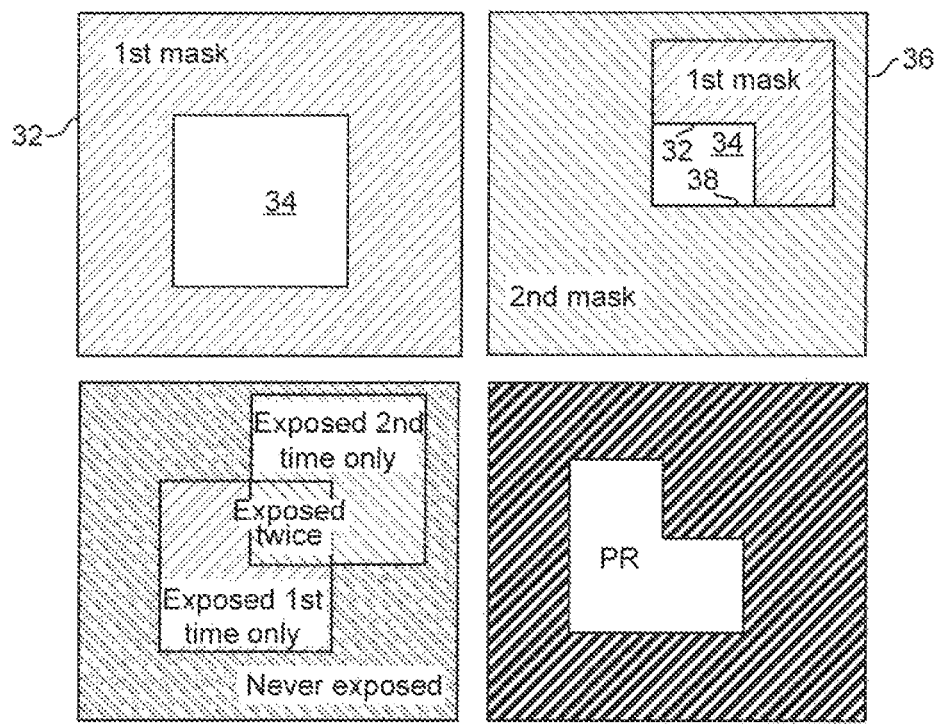

For example, referring to FIG. 3, the same resulting shape in the patterned resist can be achieved, using masks which are complementary to those used in FIG. 2. That is, as shown at the upper left in FIG. 3, the first mask 32 is principally opaque with a square/rectangular aperture or transparency 24 such that it is the negative, complement or reversal of the opaque and transparent regions of the first mask of FIG. 2. Similarly, the second mask 36, shown at the upper right of FIG. 3, is illustrated, as overlaid on the first mask 32 and has a similar square/rectangular aperture or transparency 38 which partially overlaps aperture 34 of the first mask and is thus also the negative, complement or reversal of the second mask of FIG. 2. (As with the example of FIG. 2, the second mask 36 could be physically the same mask as the first mask, 32 but displaced in location to expose different areas of the resist In the second exposure.) Using the same exposure and image reversal (e.g. baking) process as that described above in regard to FIG. 2, the exposure states are illustrated at the lower left of FIG. 3 and the resulting resist pattern after development is shown at the lower right of FIG. 3 and is essentially identical to the corresponding resist pattern of FIG. 2. It should he understood, however, as will be discussed in greater detail below, some mask combinations will, as a practical matter, produce resist patterns that may differ subtly in fidelity or other properties from the same intended or "target" pattern produced from a different combination of masks. Therefore, a particular combination of masks may be better suited to producing a given resist structure shape in the image reversal resist than another combination of masks and the optimal combination of masks may differ in dependence upon numerous factors of the overall resist structure shape to be produced such as contiguous primitive resist pattern shapes, particular properties of the resist, minimum feature size, pattern regularity, pattern density, proximity effects and the like. Determination of the optimal combination of primitive masks to produce a given resist pattern shape for a particular application as will be discussed below is considered to he within the scope of the present invention as a perfecting feature thereof even though such a perfecting feature is not necessary to the successful practice of the invention in accordance with the basic principles of the invention.

Figure 4:
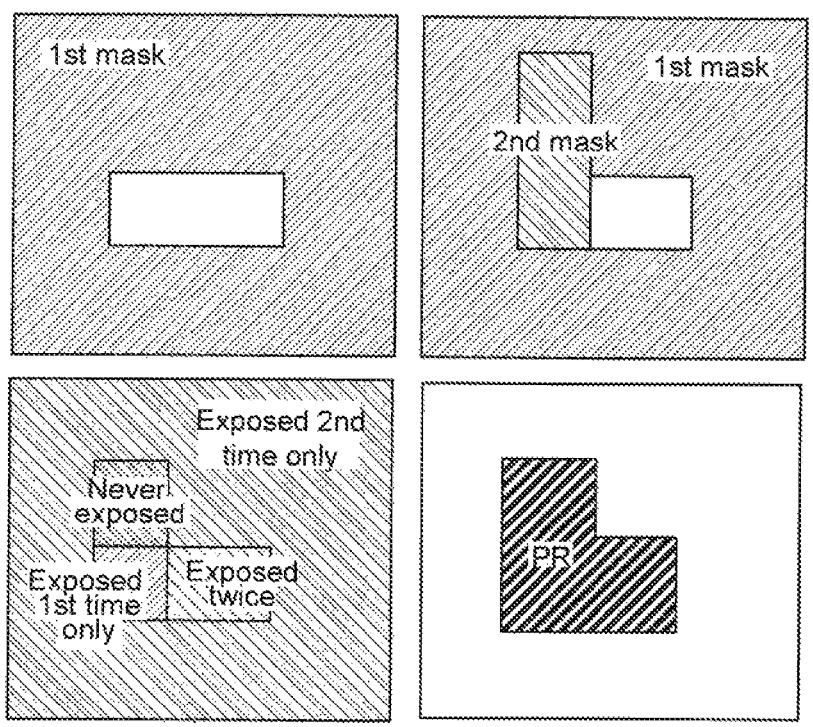

As another illustrative example using masks producing different exposure patterns, a resist pattern structure which is the complement of the resist pattern structure of FIGS. 2 and 3 is Shown in FIG. 4. The first mask pattern comprising a rectangular aperture or transparency is shown at the upper left of FIG. 4. The second mask, comprising an opaque rectangle is shown overlaid on the first mask at the upper right of FIG. 4. The exposure states of the image reversal resist arc shown at the lower left of FIG. 4 and, after development, the resulting patterned resist structure-is shown at the lower right and is seen to be the complement, negative or reversal image of the resist pattern structure produced in accordance with either FIG. 2 or FIG. 3. The resist structure pattern of FIG. 4 could also be developed using somewhat different masks using an image reversal resist that responded as a negative resist and yet different mask patterns.

Figure 5:
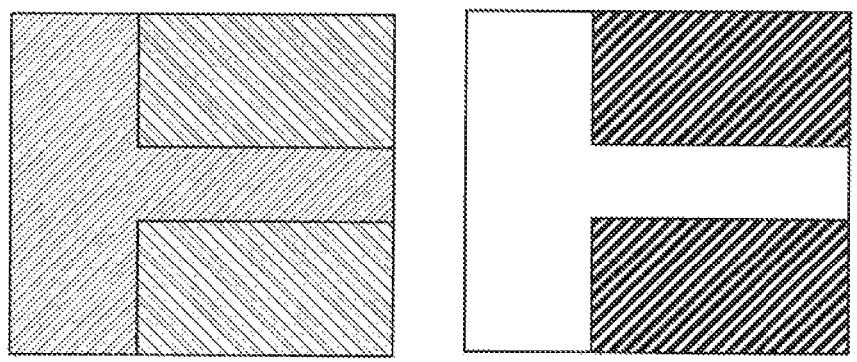

It should be noted that not all of the exposure states need to be used in the practice of the invention. For example, if the first and second masks are complementary, as shown in FIG. 5, the respective areas of the resist will be exposed only once by either the first or second mask and the "never exposed" and "twice exposed" exposure states will not be produced. It should be appreciated that, in such a case, small registration errors are substantially irrelevant to the patterned, resist structure finally produced since the registration errors will merely result in regions of the remaining two exposure states having transverse dimension that differ slightly from the intended resist pattern shape. The exposure could also be mutually exclusive and non-overlapping such, that "never exposed" areas are formed without forming a "twice exposed" exposure state. It should also be appreciated that since the process in accordance with the invention produces different images based on the masks used as the first and second masks respectively, the order in which masks are used in the respective first and second exposures is not commutative, even though both patterned exposures contribute to the resist structure pattern, since the image reversal processing causes the image reversal resist to respond to the first exposure, upon development, as a negative resist rather than as a positive resist and can be used as such.

It should also be appreciated that multiple, preferably rectangular, mask shapes may be included in one or both masks or be produced by multiple first or second exposures. The mask shapes illustrated in FIG. 6 will be recognized as topologically similar to those discussed above in connection with FIG. 4 but are proportioned and overlaid differently to result in a "T" shaped resist structure rather than and "L" shaped resist structure. It should be noted that the "T" shaped resist structure appears quite frequently in integrated circuit designs but is particularly subject to distortion and being produced with poor fidelity. However, the invention provides for its production with a much improved degree of fidelity, as will be discussed in greater detail below.

It should be appreciated from FIG. 6 that many differently shaped resist structures can be produced using the same pair of masks but with different overlay shifts. Just as FIG. 6 showed that a "T" shaped resist structure can be produced from masks topologically similar to the masks of FIG. 4, FIG. 7 Illustrates that, for example, a plurality of square mask patterns such as were discussed above in connection with FIGS. 2 and 3 to produce an "L" shaped resist structure, the same or differently sized or separated (or differently demagnified and possibly exposed in a step-and-repeat exposure process such that spacing and/or image size may be altered) mask features can be overlaid with a different shift or offset in respective exposures to produce an array of "L" shaped resist structures or and array of cruciform resist structures. So-called nanoribbon structures can also be produced by using square or rectangular mask patterns (having much smaller aspect ratios than the nanoribbon) with different demagnifications and offsets.

It should be appreciated that any or all of the above examples can be employed in virtually any combination in order to obtain resist structures or portions thereof of various shapes and that those shapes can be produced in any combination to develop larger composite resist structures of any desired shape. Such combinations of shapes and various combinations of primitive mask patterns will be apparent to those skilled in the art from the above examples. Thus, in summary of the above examples and to generalize application of the invention in accordance with its basic principles, FIG. 8 shows a pair of masks having a shape intended to represent substantially arbitrary mask feature shapes. It should be noted that circular masks have the distinct advantage over rectangular shapes in that they are not subject to corner rounding diffraction effects. Thus resist structure patterns of arbitrary complexity can be generated by overlay of two primitive masks. Thus, if n primitive masks are provided, it can be shown that they can be used by overlaying them in various combinations to provide an additional n+B(n,2) masks where B(n,2) is the binomial coefficient defined by:

$$B(n,2)=n!/2!(n-2)!.$$

This equation is the number of possible combinations of overlaying of two masks fern a pool of n masks from which to choose. Essentially, any arbitrarily complex mask shapes that may be required can be decomposed into primitive masks which can then he used in combination to generate composite masks and employed In the method described above in regard to FIG. 2.

As a variant embodiment of the invention that may be particularly useful in producing resist structures of complex shapes and increasing fidelity of some portions of features of patterned resist strictures, the processing of FIG. 2 can be modified by the additional step of developing; the image reversal resist as a positive resist after the Initial exposure using the first mask and prior to the image reversal process (e.g. baking). This variant of the invention will now be discussed in connection with FIGS. 9-13. This variant of the invention is particularly capable of producing complex patterns since it provides for a third mask and exposure process (e.g. two mask and exposure processes before image reversal processing). This variant embodiment of the invention can also he conceptualized as the same processing discussed above but starting with a patterned layer of resist rather than a blanket layer of resist.

Figure 9:
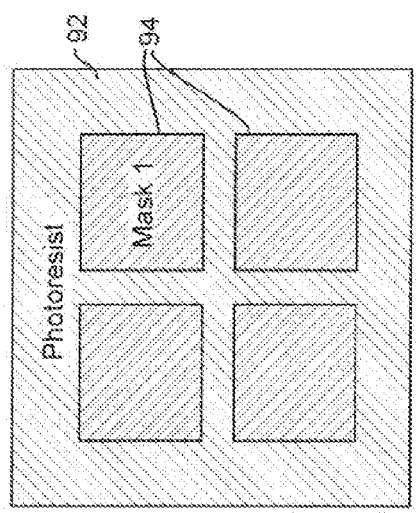

FIG. 9 shows, in plan view, a substrate or layer of material covered by image reversal (IR) resist 92, preferably applied by a spin-on process, which is overlaid (e.g. by projection) with an exemplary mask, pattern 94, depicted as four opaque squares. An exposure is then made and the image reversal resist is then developed to remove the exposed resist, resulting in the resist pattern of FIG. 10 since the image reversal resist acts as a positive resist since the image reversal processing has not yet been performed.

Figure 12:
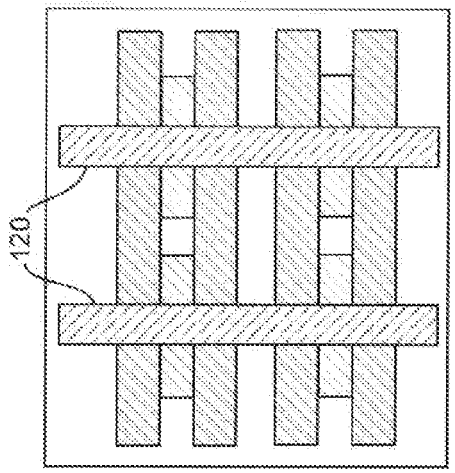

It should be understood that fine unexposed resist remaining in place after development is substantially unaffected by development in that it remains sufficiently sensitive to energy that another patterned exposure of the resist, now patterned as illustrated, can be made. To perform this patterned exposure, a further mask 110 comprising, in this example, a plurality of horizontal stripes partially overlapping the remaining areas of resist, is now applied (e.g. by projection or physically overlaid on the resist) illustrated in FIG. 11 and a further exposure made. The image reversal processing (e.g. baking) can now he performed and a further patterned exposure made using mask 120, comprising, in this example, a plurality of vertical stripes, again overlapping remaining areas of image reversal resist as shown in FIG. 12. When development is performed the resulting patterned resist structure will be (for the exemplary masks illustrated in this example) as shown in FIG. 13 as a plurality of cruciform shapes. It should also he appreciated that, in addition to allowing for substantially increased pattern complexity of the final resist structure, this variant embodiment of the invention can also avoid rounding of outside corners 130 since the edges 130 at the ends of the salient portions of the cruciform shape are formed from longer edges of the patterned resist formed by the first patterned exposure and development. Thus, the invention is capable of substantially eliminating a particularly ubiquitous type of shape distortion which is characteristic of known lithographic processes prior to the present invention.

The invention is also capable of substantially reducing or eliminating a further form of distortion of inside comers of resist pattern structures which is also characteristic of known lithographic processes prior to the present invention. FIG. 14 shows a cruciform shape similar to the shapes produced by the process sequence discussed above in connection with FIG. 9-13. The intended outline of this shape is as depicted at 140. If such a shape is to be produced by conventional single exposure (and most multiple exposure) lithographic techniques, rounding of outside corners and some degree of rounding or fill of inside corners Is inevitable; due to diffraction effects reducing effective exposure at outside comers and the interaction of diffraction effects from intersecting edges (e.g. edges A and B increasing effective exposure In a region that may be visualized as bounded by line C). When the shape is produced at relatively large size on the order of half a micron (500 nm), the shape remains reasonably well-resolved, as shown at 142. However, as such a shape is scaled to smaller sizes for a given exposure process, these distortion effects are increased leading to a foreshortening of the salient portions of the shape and increased fill of the inside corners as shown at 544 and 146 (350 nm and 220 nm, respectively) to the point (at 32 nm or smaller) that the shape is no longer recognizable as cruciform but more closely resembles a rectangle rotated by 45° as shown at 148. Similar diffraction effects will occur using conventional lithographic techniques at any point where edges of a shape intersect, such as in a "T" shaped resist structure. Such distortions are not confined to inside and outside corners of a given shape but may be caused in conventional lithographic techniques by proximity of edges of other shapes which are sufficiently close to a resist structure for interference of diffraction effects to occur. An example of such distortion due to proximity of shapes is shown in FIG. 15. It should also be appreciated that, in practice, such distortions may be exaggerated in structures formed by further lithographic process employing the patterned resist structure since a narrow (and generally thinned) resist structure is normally attacked to some significant degree and may also be undercut by other lithographic reactants such as etchants.

Therefore, in conventional lithographic processes, it is necessary to use so-called optical proximity correction (OPC) which is essentially a predistortion of the mask shapes that corrects, to some degree, for distortions due to diffraction effects. However, these techniques are very time-consuming and expensive due to the difficulty in computing what the diffraction effects will be and their likely degree of reinforcing interference as well as determining the degree of predistortion of mask shapes which will yield suitable reduction of diffraction distortion over the entire chip pattern while such OPC will generally cause even greater proximity of edges of exposed shapes.

A comparison of an exemplary portion of a chip pattern formed without OPC and with OPC is shown in FIG. 16. It is readily seen that, without use of OPC, some structures are formed with gaps or otherwise misshapen while, through the use of OPC, the structures are more-or-less correctly formed although rounding of outside corners and fill of inside corners remains evident. In other words, some degree of distortion remains even when OPC is optimally utilized. These forms of distortion can be substantially eliminated by use of the invention since rounding of outside corners can be completely eliminated through use of the variant embodiment of the Invention described above in connection with FIGS. 9-13 and fill of inside corners can be eliminated by forming all shapes through use of mask shapes that do not include inside corners, such as rectangles, which are entirely sufficient to provide any desired arbitrary shape, as demonstrated above. If mask shapes are constrained in such a manner that ho inside corners are included, the multiple exposures of a single resist layer in accordance with the invention can be made such that no intersecting edges forming an inside corner will be concurrently exposed and the diffraction effects of one exposure cannot constructively interfere with each other. In other words, the exposures can be arranged by virtue of the invention so that each exposure "sees" only straight lines that do not intersect to form inside corners and no diffraction interactions can occur from such exposures made at different times and which partial exposures due to diffraction effects would have, in any case, opposite effects on final development of the image reversal resist, due to image reversal processing between exposures. Further, due to Image reversal processing of patterned exposures in accordance with the invention, partial exposures due to diffraction effects are generally in different locations and cannot constructively interfere for that reason, as well. It should be noted in this regard, that these advantages can be obtained where a sequence of exposures using primitive masks are made for producing a composite exposure before or after image reversal processing and/or initial resist patterning by development after an initial exposure in accordance with the variant embodiment of the invention as long as adequate separation between features in the composite exposure is observed.

The versatility of the invention and its ability to form common semiconductor device structures by multiple exposures of a single resist layer with image reversal processing between two exposures will now be discussed with reference to the schematic plan view and cross-sectional view illustrations of FIGS. 17-20. It will be appreciated from these illustrations and the following discussion that each of the exemplary processes and resulting identical final structures can be provided in accordance with the invention with approximately one-half of the number of process steps that are required in conventional lithographic processes prior to the invention. Further, from the variety of these examples, it can be easily seen that the invention can he applied to any semiconductor process that requires a resist and can achieve any desired patterning that may he encountered in semiconductor manufacture.

Figure 17:
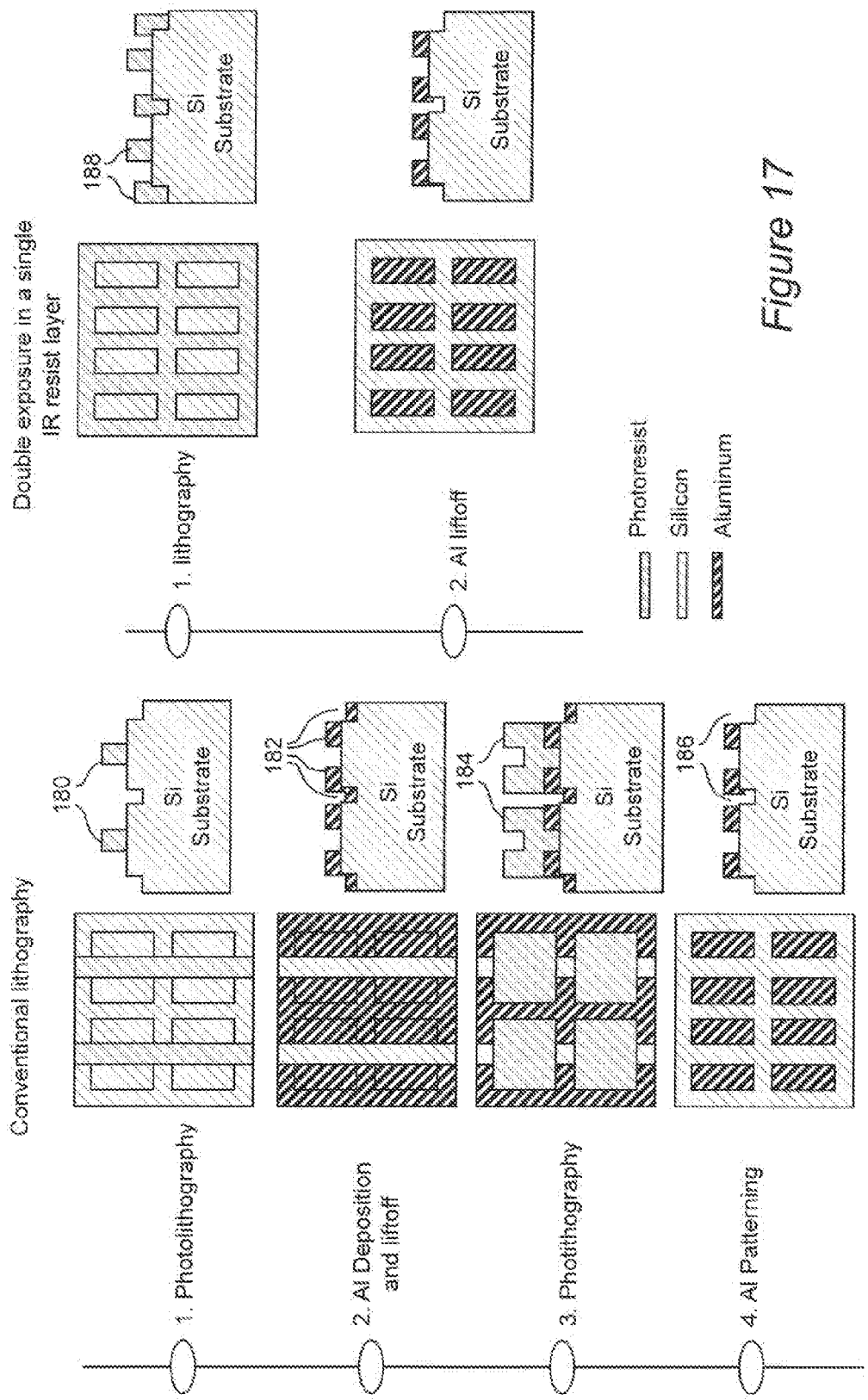

In FIG. 17, source/drain contact patterning is compared between conventional lithographic process on the left and in accordance with the invention on the right. Using conventional lithography, a mask 180 must be provided (step 1) to separate the source and drain contact areas prior to depositing a blanket layer of metal such as aluminum and lift-off to partially pattern the metal 182 (step 2) then, a further resist mask 184 must be applied and patterned to complete patterning of the metal to remove metal from regions 186. In contrast, utilizing the invention and beginning with the same substrate topology, a single, more complex and multi-level lithographic resist structure 188 can be formed. Then, a blanket deposition of metal can be performed and followed by lift-off of the resist structure and overlying metal such that the metal can be fully patterned in a single lithograpic process.

Figure 18:
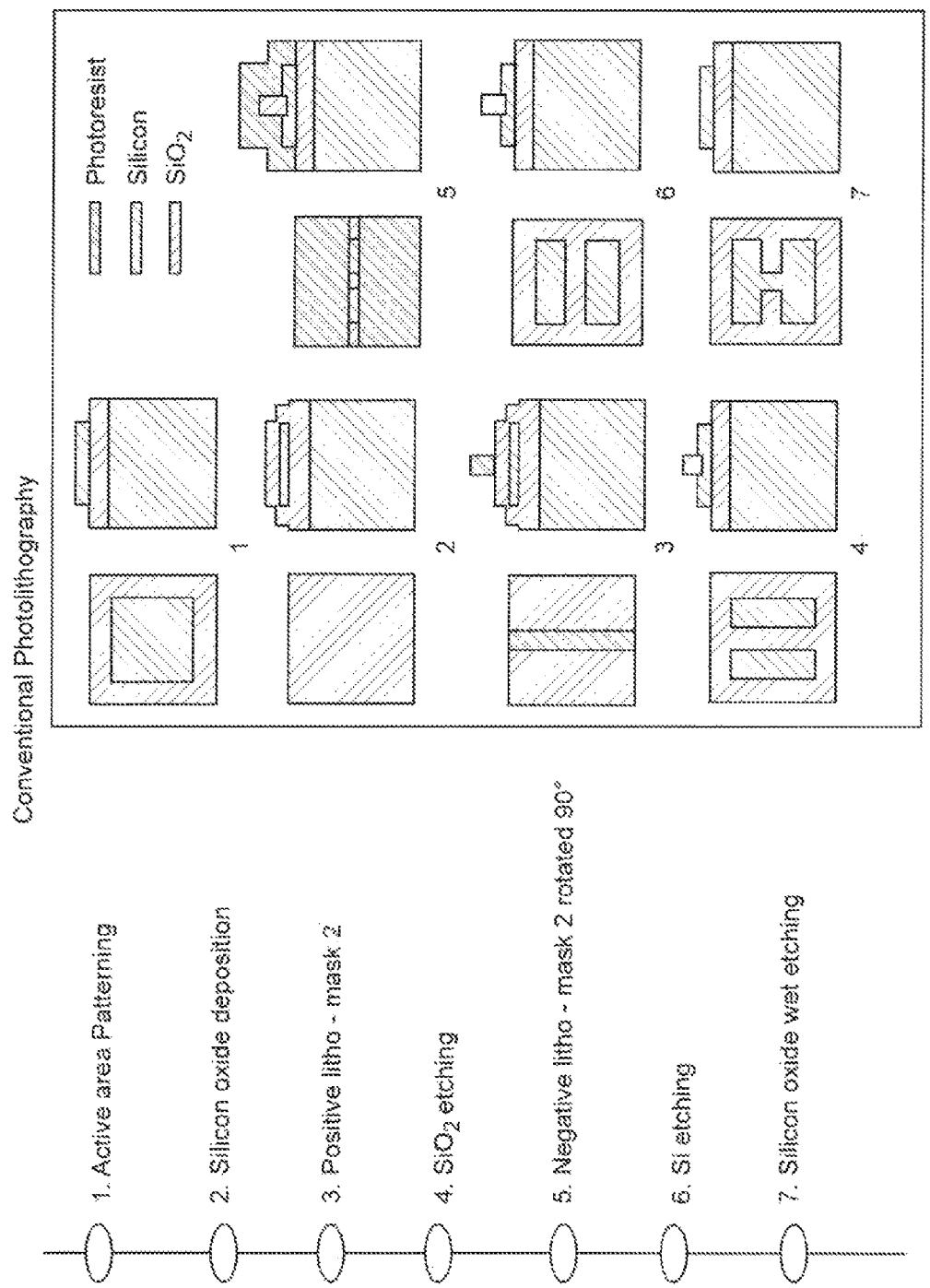

FIG. 18 illustrates steps of forming a nanoribbon structure alluded to above. The active area must first be patterned by a first lithographic process (step 1 ) and silicon oxide ($SiO_2$) deposited (step 2), then, a (positive) resist mask is patterned (step 3) and the $SiO_2$ is etched (step 4). A (negative) resist mask structure (rotated 90°) is then formed (step 5) and the substrate (e.g. silicon) is etched (step 6) and wet etching of the silicon oxide is performed (step 7) to complete die structure.

In contrast, two different methods of forming a nanoribbon structure are illustrated in FIG. 19. Active area patterning is performed (step 1) as in the conventional process of FIG. 19. However, double exposure of a single resist layer can be performed with the same mask, rotated between exposures (step 2) and dry etching of the active area directly performed (step3) to complete the device. Alternatively the variant embodiment of the invention discussed above involving two exposure and two resist developments with image reversal (step 1) can be used to concurrently pattern the active area and define the nanoribbon shape which can be followed by dry etching (step 2) to compete the device. From FIGS. 17-19, it can be seen that one significant advantage of the present invention is emulation of the same printing capability of conventional lithography with significantly reduced complexity and corresponding cost while providing some improvements in image fidelity, if needed, and reducing or eliminating diffraction distortion effects.

FIG. 20 illustrates how the invention can be employed to replace complex and expensive double pattern lithography (DPL), discussed above, which is often required to increase the pith of semiconductor structures beyond the pitch that can be resolved in a given lithographic exposure. In the conventional process on the left of FIG. 21, The conventional DPL process includes a hard mask to which the pattern of each of a sequence of resist structures is transferred (steps 2 and 4), each of which requires the application and patterning of a separate layer of resist (steps 1 and 3. Finally, the pattern resulting in the hard mask is transferred to the substrate or underlying layer of material. In sharp contrast, use of the invention allows the hard mask to be omitted altogether using two exposures of a single layer of resist with image reversal processing between the two (or three, using the variant embodiment of the invention) exposures. Additional exposure can be performed either before or after the image reversal processing as a composite exposure using a sequence of primitive masks as discussed above. It should be noted, particularly in regard to this example, that the conventional technique is necessarily made subject to registration or overlay errors at each application of a new resist whereas the invention can completely avoid such registration or overlay errors by the simple expedient of providing for image inversion processing (e.g. baking, such as by an in-situ anneal) to be performed in the exposure tool. (An in-situ annealing process using heat may require thermal separation of the wafer from the optics of the exposure tool such as by insulation and/or thermal stabilization of the optics or even removal of the optics from the active position in the exposure tool during any thermal processing. Thermal processing may also be accomplished with reduced heating of the tool by providing, for example, resistive heating in the wafer chuck, a laser anneal from the back side of the wafer, Infra-red lamp heating with one Or more lamps installed in a casing with a shutter or in a manner allowing irradiation of the wafer through, for example, mirrors in order to reduce heating of the optics of the exposure tool. It may also be possible to achieve image reversal through chemical or catalytic processing, either alone or in combination with thermal processing, that may be performed within the exposure tool.) This meritorious effect of the invention is also applicable to the examples and variant embodiment of the invention discussed above.

In view of the foregoing, it is seen that the invention provides a lithographic technique that is distinguished from conventional usage of image reversal resist by providing a second patterned exposure instead of a flood exposure and is distinguished from conventional single or multiple exposure lithographic processes by provision of image reversal processing and/or development between exposures. The invention is capable of forming resist structures of any shape that may be required for semiconductor manufacturing with higher fidelity to mask shape than has been previously been achieved while doing so with, in many cases only about one-half the number of required process steps. The invention further allows avoidance of the most ubiquitous types of shape distortion due to diffraction arid proximity effects and allows avoidance of some types of overlay errors or their effects. The performance of the invention can be marginally improved by use in combination with other sophisticated lithography techniques but achieves sufficiently high shape fidelity that such expensive, critical and time-consuming processes can be omitted In all but the most dimensionally critical cases.

As discussed above, the Invention provides numerous combinations of masks that can be used to produce a resist structure of any given shape. While the patterns of the resist structures that result from mask combinations that can be used to form them should theoretically be identical, the resulting shapes or their properties may differ in subtle but potentially important ways in regard to effective resolution, fidelity and relative degree of freedom from distortion, all of which qualities will hereinafter be referred to as printability.

Therefore, as a perfecting feature of the invention which is considered to be highly desirable but not necessary to the successful practice of the invention in accordance with Its basic principles, an algorithm which may be implemented on a suitably programmed data processor has been devised by the inventors to allow choice of optimal masks, such as primitive masks alluded to above, in accordance with the invention to be practiced in an automated fashion. It should be borne in mind during the following discussion that a similar algorithm can be developed and will be apparent to those skilled in the and from the following discussion that will provide mask combinations that satisfy criteria other than those enumerated above. It is also to be understood that the algorithm as will be discussed below may or may not be optimal for use with and does not provide for optimal choice of the initial mask used in the variant embodiment of the invention described above, but extension of the methodology of the algorithm discussed below to such an embodiment of the invention will be apparent to those skilled in the art in light of the following description.

For purposes of the following discussion it is assumed that a layout of the mask pattern has been performed in the usual manner. In fact, the methodology of preparation of the mask pattern and the technologies that may be represented therein are irrelevant to the practice of this perfecting feature of the invention. It is also assumed that the desired mask pattern can be decomposed into elemental patterns that can be sub-divided into matrices. For purposes of discussion and simplicity of Illustration, a 3×3 matrix will also be assumed. However, one or more different matrix sizes (e.g. 3×4, 4×4, 4×5, 5×5, . . . m×n) can clearly be used in accordance with the analytic principles of this algorithm and may yield computational economies in some cases where a favorable trade-off between the number of primitive masks employed and the number of matrix "tiles" into which a mask pattern maybe decomposed can be determined.

The algorithm for choosing masks for optimizing printability comprises two phases: decomposition of the desired chip pattern into combinations of elemental masks of a given matrix size and selecting the combination of masks which will result in best printability. The basic rules for decomposition derive from the four possible exposure states resulting from the process discussed above in regard to FIG. 2 and the response of the resist to these exposure states. Specifically, respective areas of the image reversal resist will be insoluble if never exposed, exposed twice or only exposed dining the first exposure and soluble if exposed only during the second exposure. Therefore, for resist areas that should be soluble, the corresponding areas should be opaque on the first mask and transparent on the second mask. For resist areas that should be insoluble, corresponding areas should be opaque on both masks (e.g. never exposed), transient on both masks (exposed twice) or transparent on the first mask and opaque on the second mask (exposed only by the first exposure). That is, for areas or blocks of a matrix tile that are opaque in a tile of the desired pattern initially designed, there are three different combinations of masks are available for each block or area of a single mask. These exposure options in regard to areas that should be insoluble provides substantial flexibility for mask selection for the decomposed mask and which will result in the desired pattern for a tile of the desired overall resist pattern.

For example, to produce a tile having a cruciform shaped resist structure as a tile of the overall pattern as illustrated at the top of FIG. 21, all blocks of the second mask must either be transparent or be opaque only in areas corresponding to the blocks of the uniform shape to be produced as shown in the lower tow rows of block patterns. Note that none of the second mask tiles have opaque corner blocks. Conversely, for the first mask, all potentially appropriate patterns (not all of which are shown) are opaque at all corner blocks. The same is true of the upper corner blocks and the bottom row of blocks in the tile patterns shown in FIG. 22 for producing an inverted "T" shaped resist structure pattern and upper right corner and left and bottom rows of blocks of tile patterns shown in FIG. 23 to produce an "L" shaped resist structure pattern.

It should be clearly understood that not ail of the combinations of the block patterns of tiles shown in FIGS. 21-23 will result in the desired resist structure shape for the tile. Valid combinations of first and second tile patterns can be easily and rapidly detected by assigning a first logic value (e.g. "0") to block areas that are opaque in respective tile mask patterns and areas that are to be in some in the image reversal resist and assigning another logic value (e.g. "1") to areas that are transparent In the respective tile mask patterns and areas that are to b& soluble in the image reversal resist and then interatively (or in parallel) testing respective blocks of a given tile mask pattern combination against corresponding blocks of the desired resist structure pattern in accordance with the truth table shown in FIG. 24. It will be recognized that the logical test shown in FIG. 24 is simply that of an exclusive OR gate with additional inversion of the output to reflect whether a single exposure is produced by a respective block of the first tile mask or a corresponding block of the second tile mask. The logic of this test can be even more simply embodied in the AND gate with an inverting input such that if a block of the first tile mask is logic variable A, a corresponding block of the second mask is logic variable B and C is the value of the block in the tile of the desired resist structure shape, the logic test can be expressed as:

$$A \cdot B = C$$

where "·" denotes the logical AND operation and the bar denotes the logical complement of the variable "A". If this test is toe for all blocks of a tile, the combination of tile mask patterns is valid. Accordingly, while many combinations of tile mask patterns may be presented, valid combinations can be detected very rapidly by very simple logic. The results of detected valid combinations can be visualized as tabulated for the respective shapes of FIGS. 21-23 as shown in FIGS. 25-27.

Valid combinations of masks which have been detected as discussed above can then be compared for printability. It will he recalled from the above discussion of the basic principles of the invention that the avoidance of diffraction distortions of which the invention is capable is most effective using mask patterns (or tile mask patterns) which minimize inclusion of corners and inside corners in particular. (Outside corner distortion is avoided by use of the variant embodiment of the invention discussed above in connection with FIGS. 9-13.) Therefore, the selection phase of the algorithm next continues with the detection and counting of corners presented by the respective first and second tile patterns of the valid combinations.

Specifically, the corners are detected and counted in a specific manner. First, each tile pattern of each tile mask pattern of a valid tile mask combination is inspected for groups of four blocks in a 2×2 matrix configuration as depicted in FIG. 28. From each block of each group the adjacent blocks are inspected to determine if both adjacent blocks are of a logic value of the block from which the inspection is performed (and thus the adjacent blocks must be of a logic value equal to each other). If so, a corner is "seen" by the block from which inspection is done. If not (e.g. the adjacent blocks are of different logic values) no corner is seen. This test is performed for each of the blocks of each group (e.g. rotations of the tests depicted in FIG. 28). The number of corners so detected is counted for each tile pattern mask as depicted in FIG. 29. A figure of merit (FoM) is derived by adding 1 to the number of corners counted in each tile pattern mask of a valid combination and the resulting numbers are multiplied according to:

$$FoM = (corners: mask\ 1+1) * (corners: mask\ 2+1),$$

the best (most printable) combination will exhibit the minimum figure of merit. It should be noted that the "+1" which is added to the counted number of corners in each mask is for prevent a large number of corners in one mask with zero corners in the other mask from producing an FoM=0 notwithstanding a substantial member of corners in one mask. Other algorithms for computing a FoM, such as summing the counted number of corners can also produce useful results in most or all eases.

It should also be noted that mask patterns which are the same or inverses (e.g. negative images) of each other are desirably omitted from this portions of testing and analysis. Such tile mask patterns are trivial since their patterns would also he the same as the desired shape and thus do not lead to any meaning mask decomposition.

It can be shown that for a cruel form pattern of a 3×3 tile, the corner counting method described above leads to a unique and optimal mask combination (5a and 7b of FIG. 25) for which the Figure of merit equals one. If can be seen by simple inspection that all other tile pattern masks would present a greater number of corners and thus would result in a larger FoM.

However, such a unique and optimal value does not always result from the above analysis for other shapes. For example, for an "L" shaped resist structure pattern it can be shown that three tile pattern mask combinations will result in a minimum FoM=9, as shown in FIG. 30. In such a case, the optimal (e.g. most printable) combination of tile pattern masks will be the number of blocks in respective opaque or transparent regions in the first or second mask which will form the largest rectangle or square, as illustrated in FIG. 31. Again, as discussed above, rectangular mask shapes are most effective In avoiding diffraction distortions in the final resist structure shape.

Thus it is seen that the above algorithm provides an optimal mask pattern decomposition for the image reversal, double exposure lithographic technique discussed above. However, it is to he recognized that this algorithm and other algorithms similarly employing logic and corner counting ace likely to be applicable to other lithographic technologies since they are principally directed to the most ubiquitous distortions observed in lithographic processes.

While the invention has been described in terms of a single preferred embodiment, a variant embodiment and a perfecting feature, those skilled in the art will recognize that the invention can be practiced with modification within tire spirit and scope of the appended claims.

Having thus described my invention, what I claim as new and desire to secure by Letters Patents is as follows:

1. A lithographic process comprising steps of
applying an image reversal resist to a surface,
performing a first patterned exposure to expose a selected area of said image reversal resist using a first mask,
performing image reversal processing of said image reversal resist,
performing a second patterned exposure to expose another selected area at least partially overlapping with said selected area of said first patterned exposure of said image reversal resist using a second mask subsequent to said image reversal processing,
and developing said image reversal resist to form a resist structure having a desired, composite shape differing from shapes of both said selected area and said another selected area.

2. The method as recited in claim 1, wherein said first exposure and said image reversal processing causes the image reversal resist, upon development, to respond to said first exposure as a negative resist.

3. The method as recited in claim 2, wherein areas of said image reversal resist which are not exposed by said first exposure, after said image reversal processing responds to a further exposure as a positive resist.

4. The method as recited in claim 3, wherein said further exposure is said second exposure.

5. The method as recited in claim 1, wherein areas of said image reversal resist which are not exposed by said first exposure, after said image reversal processing responds to a further exposure as a positive resist.

6. The method as recited in claim 5, wherein said further exposure is said second exposure.

7. The method as recited in claim 1, wherein at least one of said first exposure and said second exposure comprises a plurality of exposures.

8. The method as recited in claim 7, wherein said multiple exposures expose areas more proximate than can be resolved in a single exposure.

9. The method as recited in claim 8, including the further step of
performing a third patterned exposure of a selected area of said image reversal resist, and
developing said image reversal resist,
said third patterned exposure and said developing of said image reversal resist being performed prior to said first exposure and causing removal of selected areas of said image reversal resist exposed by said third exposure.

10. The method as recited in claim 1, including the further step of
performing a third patterned exposure of a selected area of said image reversal resist, and
developing said image reversal resist,
said third patterned exposure and said developing of said image reversal resist being performed prior to said first exposure and causing removal of selected areas of said image reversal resist exposed by said third exposure.

11. The method as recited in claim 1, comprising further steps of
determining a combination of mask patterns respectively corresponding to said performing of patterned exposures of said first selected area and said another selected area which is valid, in combination, to produce said desired, composite resist structure shape,
counting corners in each of said mask patterns of said combination of mask patterns which is valid to produce said desired resist structure shape,
combining number of corners counted in each mask of said combination in said counting step to derive a figure of merit, and
selecting a combination of mask patterns having a minimum value of said figure of merit.

12. The method as recited in claim 11, including the further step of
selecting between combinations of mask patterns having equal figures of merit by selecting a mask pattern having the largest rectangles or squares.

13. The method as recited in claim 11, wherein said step of determining validity of combinations of mask patterns includes
dividing the masks and desired shape of a resist structure into corresponding areas,
assigning logical values to said elemental areas depending on whether the elemental areas of the masks are transparent or opaque and whether the elemental areas of the resist structure a to be soluble or insoluble upon development, and
testing said elemental areas of said masks against said elemental areas of said desired resist structure using a logic equation.

14. The method as recited in claim 1, wherein said image reversal processing includes baking.

15. The method as recited in claim 1 wherein said image reversal processing is performed in-situ in a lithographic exposure tool.

16. A method of selecting an optimal combination of masks for producing a desired resist structure shape, said method comprising steps of
determining a combination of mask patterns which is valid, in combination, to produce a desired, composite resist structure shape from exposures in accordance with selected individual ones of said mask patterns which are at least partially overlapping,
counting corners in each of said mask patterns of said combination of mask patterns which is valid to produce said desired resist structure shape,
combining numbers of corners counted in each mask of said combination in said counting step to derive a figure of merit, and
selecting a combination of mask patterns having a minimum value of said figure of merit.

17. The method as recited in claim 16, including the further step of
selecting between combinations of mask patterns having equal figures of merit by selecting a mask pattern having the largest rectangles or squares.

18. The method as recited in claim 16, wherein said step of determining validity of combinations of mask patterns includes
dividing the masks and desired shape of a resist structure into corresponding areas,
assigning logical values to said elemental areas depending on whether the elemental areas of the masks are transparent or opaque and whether the elemental areas of the resist structure a to be soluble or insoluble upon development, and
testing said elemental areas of said masks against said elemental areas of said desired resist structure using a logic equation.

19. A structure including
a substrate or layer of material having a surface,
a layer of image reversal resist applied to said surface, said layer of image reversal resist having been exposed by a patterned exposure in selected areas and subjected to image reversal processing and another patterned exposure which at least partially overlaps said selected area exposed by said paltered exposure such that said selected areas of said layer of image reversal resist exposed by said patterned exposure, upon development, respond to said patterned exposure as a negative resist and areas of said layer of image reversal resist not exposed by said another patterned exposure, upon development, respond to said another patterned exposure as a positive resist.

20. The structure recited in claim 19, wherein said image reversal resist covers only selected areas of said surface of said substrate or layer of material.

* * * * *